United States Patent [19]
Aoki et al.

[11] Patent Number: 4,661,929
[45] Date of Patent: Apr. 28, 1987

[54] SEMICONDUCTOR MEMORY HAVING MULTIPLE LEVEL STORAGE STRUCTURE

[75] Inventors: Masakazu Aoki, Tokorozawa; Yoshinobu Nakagome, Hachioji; Masashi Horiguchi; Shinichi Ikenaga, both of Kokubunji; Katsuhiro Shimohigashi, Musashimurayama, all of Japan

[73] Assignee: Hitachi, Ltd., Tokyo, Japan

[21] Appl. No.: 686,018

[22] Filed: Dec. 24, 1984

[30] Foreign Application Priority Data

Dec. 23, 1983 [JP] Japan .................................. 58-242021
Jul. 9, 1984 [JP] Japan .................................. 59-140511
Jul. 19, 1984 [JP] Japan .................................. 59-150057

[51] Int. Cl.$^4$ ............................................. G11C 11/40
[52] U.S. Cl. ..................................... 365/189; 365/149; 365/230
[58] Field of Search ............... 365/149, 182, 189, 230

[56] References Cited

U.S. PATENT DOCUMENTS 4,567,579 1/1986 Patel et al. ........................ 365/189

Primary Examiner—Terrell W. Fears
Attorney, Agent, or Firm—Antonelli, Terry & Wands

[57] ABSTRACT

In a semiconductor memory includes a memory array consisting of a plurality of memory cells respectively having at least one storage capacitor, an addressing circuit which designates location of each memory cell, data lines which transmit data connected to said memory cells and data writing and reading circuits connected to said data lines. The semiconductor memory has a multiple level storage structure. In particular, the memory includes an arrangement for sequentially applying, on a time series basis, different voltages of at least 3 levels or more to the gate of a switching MOS transistor of said memory cells, a bias charge supplying means as said data reading circuit and a column register providing at least two or more storage cells which temporarily store said data.

28 Claims, 58 Drawing Figures

FIG. 7(A)
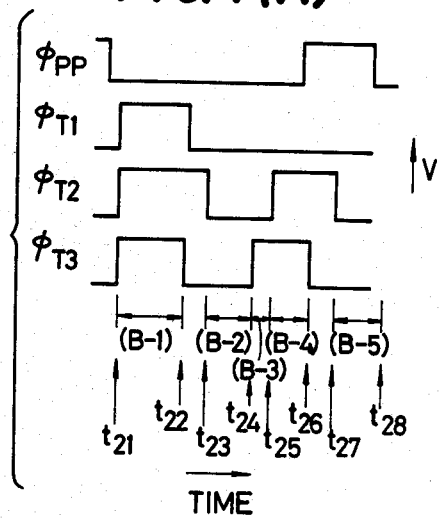
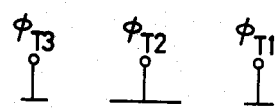
FIG. 7 (B-1)
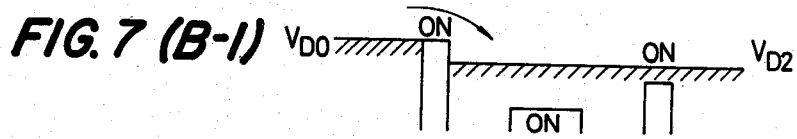
FIG. 7 (B-2)
FIG. 7 (B-3)
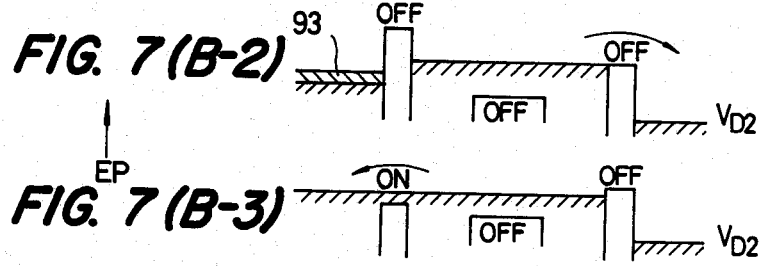
FIG. 7 (B-4)
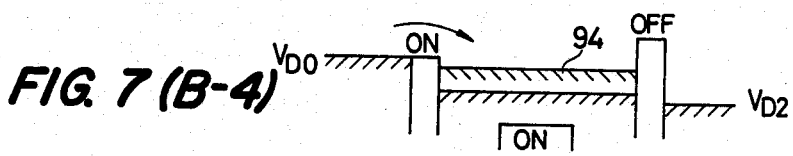
FIG. 7 (B-5)
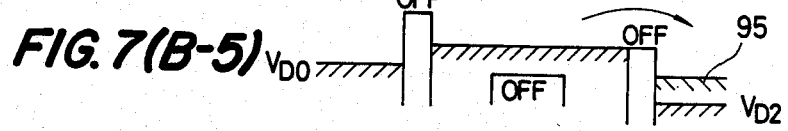

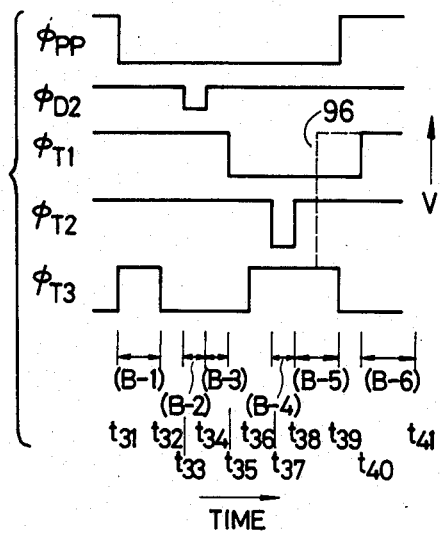
FIG. 8(A)
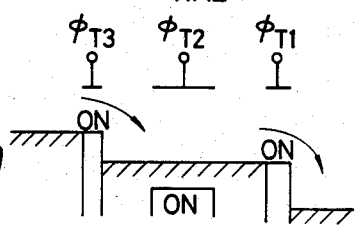
FIG. 8(B-1)
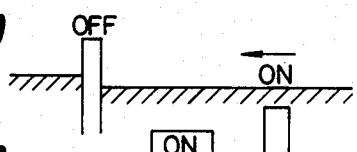
FIG. 8(B-2)
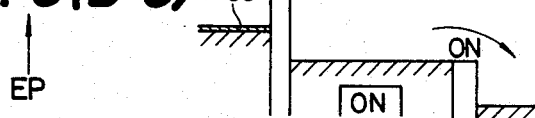
FIG. 8(B-3)
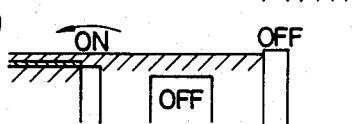
FIG. 8(B-4)
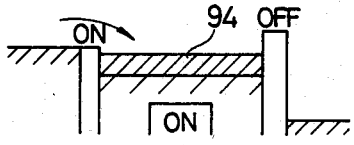
FIG. 8(B-5)
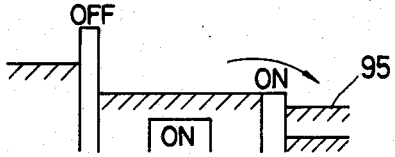
FIG. 8(B-6)

SEMICONDUCTOR MEMORY HAVING MULTIPLE LEVEL STORAGE STRUCTURE

BACKGROUND OF THE INVENTION

The present invention relates to a semiconductor memory and particularly to a semiconductor multilevel memory having multiple storage levels of information per memory unit even under a low power supply voltage and which consumes less electrical power.

A semiconductor memories having a higher integration density, represented by a dynamic random access memory (hereinafter abbreviated as DRAM), have been developed year after year and a memory unit of semiconductor memory (hereinafter referred to as memory cell) and peripheral circuits are more and more superminiaturized. However, improvement in integration density by such superminiaturization must usually be accompanied by a large stride of advancement of element process technology such as photolithography etching, etc. and therefore a certain period is usually required for development of element process technology.

Meanwhile, demands for a very high density semiconductor memory are increasing continuously and for example, a semiconductor memory having a large capacity and less power consumption is craved for newly developed field such as a small size office computer and the terminals thereof which have recently showed fantastic growth. Namely, existing semiconductor memories are not only insufficient from the point of view of integration density but also from the point of view of power consumption and other performances.

In order to meet such requirements, a memory having a multiple level storage structure (MLS memory) is considered as an effective means for realizing a semiconductor memory having a higher integration density by the current process technology. This memory is intended to substantially increase integration density by causing a single memory cell to store the data of more than two (2) levels.

As an MLS memory, a charge transfer device (hereinafter referred to as CTD) is well known. These are explained in detail, for example, in L. Terman et al. IEEE Journal of Solid-State Circuits. Vol. sc-16, No. 5, pp. 472-478, October 1981. and M. Yamada et al. Proceedings of the 9th Conference on Solid-State Devices, Tokyo 1977, pp. 263-268, issued on January 1978.

However, the MLS memory using CTD is not yet often put into practical use, because the number of levels cannot be increased sufficiently to prevent the situation that multilevel data of an analog signal is substantially attenuated due to finite transfer efficiency peculiar to the CTD. Or, such multilevel memory is inferior because it is necessary to raise a driving pulse voltage in order to increase the transfer efficiency and such an element intrinsically has a high capacitance load and consumes a very high electrical power. Moreover, it is also inferior in such a point that a memory cell can be formed to be small because high precision A/D, D/A converters are required for loops of each CTD but integration density cannot be raised due to the restriction on the peripheral circuits.

SUMMARY OF THE INVENTION

The inventors of the present invention have thought that a dynamic memory (DRAM) for addressing by both rows and columns is caused to store the multiple level data as an MLS memory for eliminating various disadvantages of an MLS memory using the CTD described above and the A/D, D/A converters are also provided in the sensing and writing system. In the case of the memory for addressing by both rows and columns, it is no longer necessary to consider the transfer efficiency, a number of gates to be driven can be decreased and thereby power consumption can also be saved. However, a very difficult problem explained below must be solved in order to use such a DRAM as an MLS memory. Namely, even if multilevel data (analog signal) of the maximum dynamic range (multilevel data can be obtained by dividing it) of 5 $V_{pp}$ is stored in the memory cell, a parasitic data line capacitance is often larger than the capacitance of the memory cell in the order of one digit and therefore if it is read on the data line, the maximum dynamic range becomes as low as 500 $mV_{pp}$ or less. It is very difficult, however, to mount many A/D converters which amplifiy small analog signal with high accuracy and convert it into digital value, except in the case where a number of levels of multilevel signal is low. This is particularly the case when it is very difficult to provide the A/D converter for each data line if the data line pitch is not rough.

Here, it should be noted that a MLS memory can be used as an excellent large capacity memory when a number of memory cells which is equal to or larger than that of an ordinary 2-level memory are mounted on a chip in such a size as is equal to or smaller than that of said 2-level memory. Namely, when the current signal charge of one memory cell of DRAM is $Q_s'$, if the manufacturing process technique is equivalent, a signal charge allowed for one level of multilevel memory becomes about $Q_s'/N$ when a number of level is N. It is a very severe condition. Accordingly, an amplifier which can amplify a minute signal with high accuracy and a small size A/D converter with which accuracy are simultaneously required for an MLS memory for addressing both rows and columns. But such an amplifier and converter cannot be realized and accordingly an MLS memory of this type cannot be developed.

It is an object of the present invention to realize a new memory having multiple level storage structure (MLS memory) for addressing by both rows and columns and thereby provide a large capacity semiconductor memory with less power consumption.

In order to attain such objects, the present invention provides an MLS memory comprising a newly developed minute voltage amplifier which is particularly suited to a large capacity memory, a highly accurate A/D, D/A converting structure even with simplified configuration and low power consumption and peripheral circuit with less power consumption. Thereby, it is now possible to replace a magnetic disk unit which requires large a physical occupation area and electrical power with a semiconductor memory, for example, in a small size computer system.

BRIEF DESCRIPTION OF THE DRAWINGS

FIG. 7(A) shows the timings and FIGS. 7(B-1) to 7(B-5) shown the potentials of pulses for driving the amplifier of FIG. 6.

FIG. 8 shows the timings and FIGS. 8(B-1) to 8(B-6) show the potentials of the same pulses.

DESCRIPTION OF THE PREFERRED EMBODIMENTS

The present invention is explained by referring to the preferred embodiment thereof. In the following embodiment, data is carried and stored by the operations of electrons used as signal charge carriers but the holes can also be used in the same way by changing the polarity of the power supply and pulses and the conductivity type of semiconductors.

Figure 1:
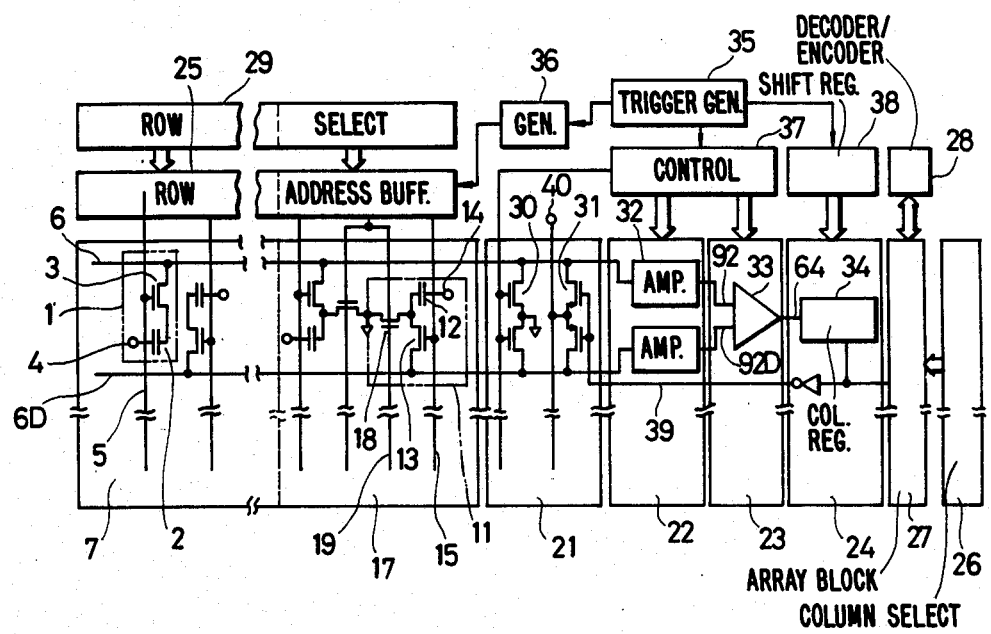
FIG. 1 is a block diagram of an embodiment of the present invention.

FIG. 1 shows a block diagram of an embodiment of an MLS memory of the present invention. In this figure, numeral 1 is a unit cell (hereinafter referred to a memory cell) of memory. 2 is a storage capacitor. 3 is a switching transistor (switching MOS transistor) which operates as a word gate. 4 is an electrode of a storage capacitor 2 which is usually connected to a DC power supply ($V_{cc}$) and earth ($V_{so}$). 5 is a word line. 6 is a data line. 7 is a block of a memory cell array. 11 is a unit of a dummy cell. 12 is a dummy storage capacitor which is selected to be ½ of the information storage capacitor $C_s$. 13 is a switching MOS transistor which operates as a dummy cell selection gate. 14 is an electrode of a dummy storage capacitor which is used in common as the electrode of a storage capacitor of the memory cell. 15 is a word line of the dummy cell. 17 is a block of the dummy cell array. 18 and 19 are a reset gate and a reset gate line of the dummy cell. 30 is a reset gate of the data line. 31 is a write gate. 21 is an array block of 30 and 31. The write gate among various gates is composed of a p-channel MOS transistor, while the others are composed of an n-channel MOS transistor. In the following figures, the p-channel MOS transistor is indicated by giving an arrow mark to the source thereof (⊢) and the n-channel MOS transistor is indicated only by (⊢). 32 is a bias charge transfer amplifier (hereinafter referred to as a BCT amplifier) which amplifies with high accuracy the signal voltages on the data line which has been divided into multilevel low voltages up to large voltages. 22 is a block of an array. 33 is a sense amplifier. 23 is an array block thereof. 34 is a column register (temporary storage cell). 24 is an array block thereof. 35 is a triggering pulse generator. 36 is a multiple-level step voltage generator. 37 is a control circuit which controls the sense systems 21, 22, 23. 38 is a control circuit (shift register) for sending timing pulses to the column registers. 29 is a row address select circuit. 25 is a row address buffer. 26 is a column address select circuit. 27 is an array block of a column address select gate and an input-output circuit. 28 is a decoder/encoder circuit block of input-output data.

In an embodiment of an MLS memory shown in FIG. 1, A/D, D/A conversion means is realized by a multiple-level step voltage generator 36 and a shift register 38 which are controlled by a triggering pulse generator 35, a row address buffer 25 which transfers multiple-level step voltage to the word line 5, a memory cell 1, a reset gate 30, writing gate 31, a column register 34, an input-output circuit 27 and a decoder/encoder 28.

Said A/D, D/A conversion means is explained first hereunder.

In the following explanation, a number of multiple levels is set to four levels (2 bits) but in actuality it is possible to select a larger number of levels.

Figure 2:
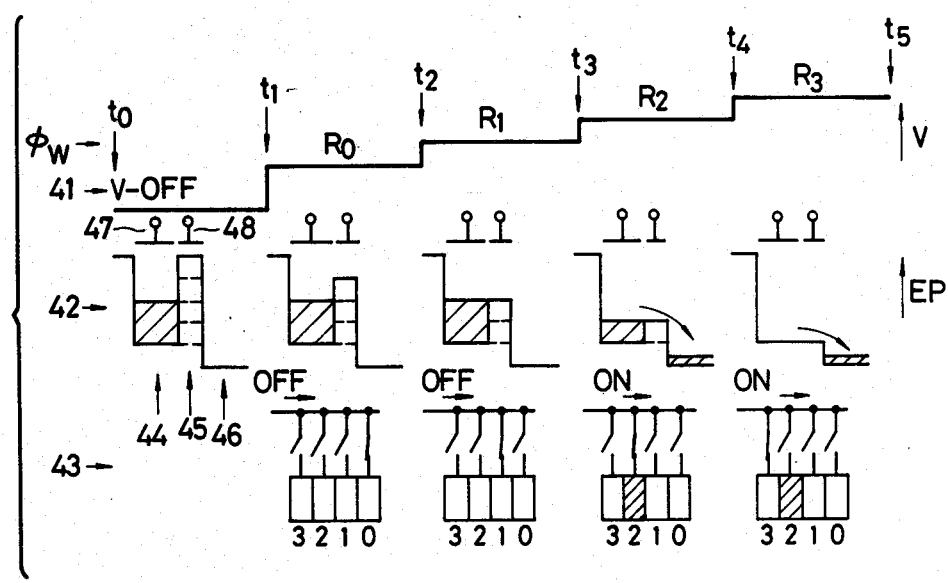
FIG. 2 is a schematic diagram for explaining the A/D conversion during the read operation by an MLS memory as the embodiment of the prent invention.

FIG. 2 shows a schematic diagram for explaining the A/D conversion means of a multiple level memory of the present invention under the data reading operation. In the same figure, 41 is a stepping voltage pulse ($\phi_w$) to be applied to the word line 5. V is the positive direction of voltage. 42 is electron potential EP of memory cell 1. 44 corresponds to a potential of storage capacitor 2, while 45 corresponds to that of word gate 3 and 46 to that of data line 5, respectively. The lower side indicates the positive direction. 47 is an electrode of storage capacitor 4 and 48 is a word gate 3. 43 is a column register of multiple level data and there are four cells corresponding to multiple levels. Here, it is supposed that the second level "2" of charge storage states ("10" in the binary data) is stored in the storage capacitor. When the stepping pulse $\phi_w$ to be applied to the word line 5 is sequentially raised corresponding to the times $t_1, t_2, t_3$ . . . no signal charge is generated up to the time $t_1$-$t_3$ but the signal charges are read on the data line 6 at the timings $t_3$-$t_4$ and $t_4$-$t_5$. The signal read out is amplified and then sent to the column register. At the timing $t_1$-$t_3$, no charge is generated and therefore the "vacant" data OFF is sent to the column register 43. Since charges are output at the timings $t_3$-$t_5$, the "existing" data ON is sent to the column register 43 and is then stored in the corresponding cell. As will be described later, when once data is stored in a cell of column register in this example, writing is not executed to the successive cells. Therefore, as shown in the figure, multiple level data stored in the memory cell is stored only to the cell at the postion "2" among the cells of column register.

The multiple level data readout above is no longer analog data but digital data. This digital data is sent to the encoder through the output lines (in this example, used as the input-output common line (I/O line); refer to FIG. 4, FIG. 11, FIG. 18, FIG. 19) and is then read as the usually employed digital data such as binary code.

The above A/D conversion system is characterized in that after signal charge is output from the memory cell, a charge packet only carries binary digital data of ON and OFF, and multiple level data is effectively carried at the timings $t_1$-$t_5$ which are given by the pulses sent from the triggering pulse generator which control the column register and the pulse $\phi_w$ applied to the word line. Thereby, signal voltages on the data line does not require amplification of high precision analog value which is required for ordinary A/D conversion and can be processed as 2-level data for ordinary memory.

Accordingly, the A/D conversion system of the present invention does not become large scale and does not require a high power circuit which interferes with the realization of a high integration density memory like the existing A/D conversion circuit. Therefore, a memory with super-high integration density can be realized with less power consumption.

Figure 3:
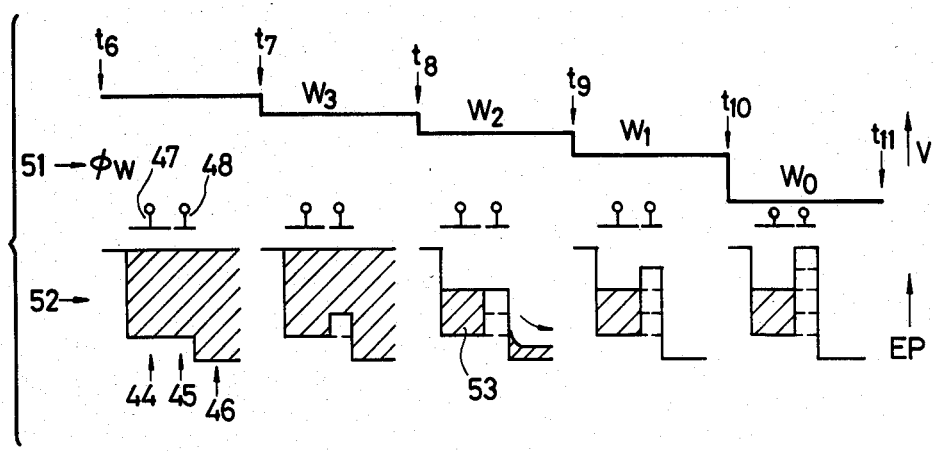
FIG. 3 is a schematic diagram for explaining the D/A conversion during the read operation by an MLS memory as the embodiment of the present invention.

FIG. 3 shows a schematic diagram indicating the D/A conversion means of an MLS memory of the present invention under the writing operation. In this figure, 51 is the stepping pulse ($\phi_w$) to be applied to the word line 5. 52 is electron potential of memory cell 1, corresponding to the positions 44-46 and electrodes 47, 48 as in the case of FIG. 2.

In the writing operation, a data line is set to a low level (0V in this case) by the reset gate 30 ($t_6$-$t_7$). When it is required to write the second level "2" of charge storage states, the data line is raised to a high level through the write gate 31 when the pulse $\phi_w$ reaches the corresponding level $t_8$-$t_9$). Thereby, the second level "2" remains as indicated by 53 in the memory cell. The write pulse decodes the write data and is given to the write gate 31 through the write lead 39 at the dependent timing. Since the D/A conversion for writing is carried out also in this case at the timing (($t_7$-$t_{11}$), the circuit structure is very simple, high integration density can be realized and power consumption is very low.

The write-read means shown in FIG. 3 and FIG. 2 have such a large characteristic that the signal charges corresponding to a level does not almost change depending on the location when the level of pulse $\phi_w$ does not change in accordance with the position because the write and read operation to/from the data storage capacitor is carried through the same gate 3. Namely, a storage capacitor is $C_s$, a threshold voltage of gate 3 is $V_{Ths}$, a voltage of pulse $\phi_w$ in the writing operation is $V_w$, a voltage of pulse $\phi_w$ in the reading operation is $V_R$, a voltage $V_s$ of storage capacitor when data is written becomes $V_s = V_W - V_{Ths}$, voltage $V_s$ after the data is read becomes $V_s = V_R - V_{Ths}$. Accordingly, the signal charges $Q_s$ to be read becomes as follows:

$$Q_s = C_s\{(V_R - V_{Ths}) - (V_W - V_{Ths})\} = C_s(V_R - V_W)$$

The substrate voltage effect is low, $Q_s$ becomes constant, irrespective of $V_{Ths}$. Therefore, if a threshold voltage $V_{Ths}$ of the memory cell disperses in places, the signal charge $Q_s$ is almost constant and data can be judged accurately. It is very important for an MLS memory having a large number of levels becuase a level is selected in such order near the dispersion of threshold voltage of MOSLSI chip in such a case that a stepping voltage $\phi_w (\Delta \phi w)$ is set, for example, to 200 mV or less.

Figure 4:
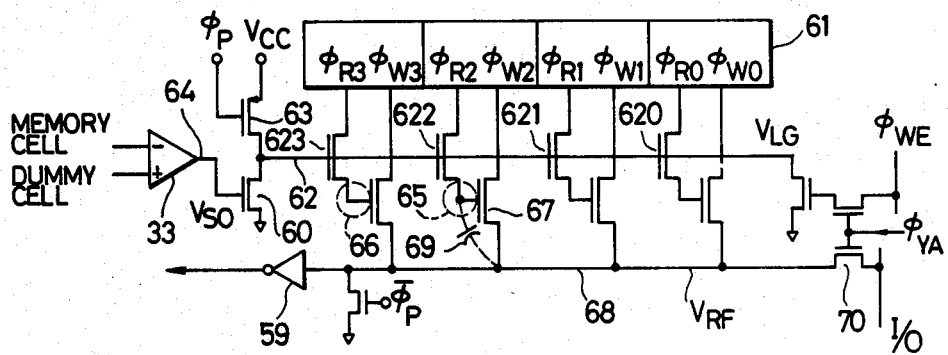
FIG. 4 is a circuit diagram of an embodiment of a column register of the present invention.
Figure 5:
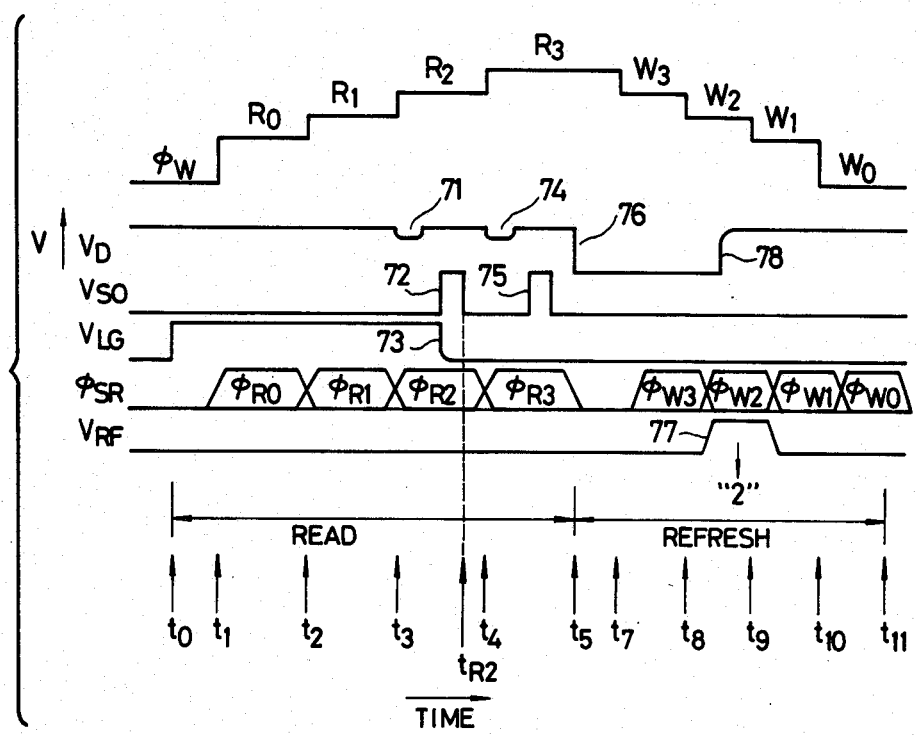
FIG. 5 shows pulse timing of the embodiment shown in FIG. 4 of the present invention.

FIG. 4 and FIG. 5 show respectively the practical example of a circuit diagram of the column register, column address select gate (Y gate) and input-output circuit block 27 (herein after explained as a part of the column register) in the embodiment shown in FIG. 1 and the pulse timing chart.

In FIG. 4, 61 is a shift register corresponding to a control circuit which controls a storage 38 shown in FIG. 1. This register sends the pulse $\phi_{SR}$ shown in FIG. 5 to the column register.

FIG. 5 shows the drive pulses and internal waveforms in the READ/REFRESH mode of the MLS memory of the present invention. In this example, the data "2" is read and the same data is written again. First, the read gates 620-623 are precharged to a high level through the precharge gate 63 at the timing $t_0$. At the timing $t_1$-$t_5$, the ascending stepping pulse is applied to the word line 5 (FIG. 1), signal charge is read to the data line 6 when the level is $R_2$ ($t_3$-$t_4$) and a voltage $V_0$ drops (71). This signal is amplified by the voltage amplifier 32, judged by the sense amplifier 33 and appears on the output terminal 64 as an output voltage $V_{so}$ (72). This process is explained in detail later by referring to FIG. 11 and FIG. 12. Therefore, a voltage of common electrode line 62 is lowered through the gate 60 (73), and a high level being given as $\phi_{R2}$ is stored in the temporary storage node 65 ($t_{R2}$). When the level is $R_3$ ($t_4$-$t_5$), charges appear on the data line (74) and an output appears at $V_{so}$ in the process similar to that mentioned above. But, since $V_{LG}$ is already lowered to a low level, a high level voltage does not enter the node 66.

Next, a voltage $V_D$ of data line 6 is reset to a low level (76) by the reset gate 30 at the timing $t_5$. The descending stepping pulse is applied to the word line 5 and the pulse $\phi_{SR}$ is sequentially applied as $\phi_{W0}$ $\phi_{W3}$ from the shift register 61 ($t_7$–$t_{11}$). At the timing $t_8$–$t_9$, when the pulse $\phi_{W2}$ becomes high level, a MOS transistor 67 becomes conductive since a high level has been stored in the node 65 of gate 67 during the READ cycle and a voltage $V_{RF}$ of refresh line 68 becomes high level (77). At this time, since the node 65 is in the high impedance, $V_{RF}$ can be boosted up to a high level as in the case of $\phi_{W2}$ without any influence of the threshold voltage, owing to the bootstrap effect by the capacitance 69 (including gate channel capacitance) between the gate and source.

The timing of level "2" output to $V_{RF}$ as indicated as 77 also appears on the I/O line through the Y gate 70 if this column is selected by $\phi_{YA}$. In this case, it is read as the 2-bit binary signal by sending it to the encoder to which the pulse being synchronized with $\phi_{W3}$ $\phi_{W0}$ is supplied.

On the other hand, an output $V_{RF}$ 77 gives an inverted output (low level) to the writing gate 31 (FIG. 1) consisting of the P-channel MOS transistor by means of an inverter 59. Thereby, a voltage $V_0$ of the data line is raised up to high level (78) and the level $W_2$ is stored in the memory cell as shown in FIG. 3 (53). Namely, this operation is called REFRESH operation.

During the REFRESH operation, the write enable signal $\phi_{WE}$ (FIG. 4) is set to low level and writing is not carried out externally. If it is required to write data externally, the signal $\phi_{WE}$ is set to high level and the signal $V_{LG}$ is set to low level, thereby the function of column register is disabled, the multiple level input signals obtained by the decoder in the I/O line side are input in the timings $\phi_{W3}$ $\phi_{W0}$ and thereby the data can be written externally into the memory cell through the REFRESH line 68.

A temporary storage (column register) providing N (or N−1) storage cells corresponding to a number of levels N has eliminated, when it is installed, a large scale circuit such as an encoder, decoder and logic gate (exclusive OR gate and AND gate) required for refresh operation from each data line and is a very important component which realizes the sense system of MLS memory with such an integration density as the DRAM in the maximum integration level. This storage has attained practically the high integration density MLS memory of the present invention for the first time. In FIG. 4, the precharge gate 63 among various gates uses the p-channel MOS transistor, while the other gates use the n-channel MOS transistors.

As is already described, it is substantially important for the MLS memory for addressing by both rows and columns to amplify with high accuracy the signal per level which has been divided into minute signals of multiple levels. In the present invention, such a requirement has been attained by providing a high performance bias charge transfer amplifier shown as 32 in FIG. 1 and an MLS memory which realizes a large number of multiple levels even at a low voltage has been embodied for the first time.

Figure 6:
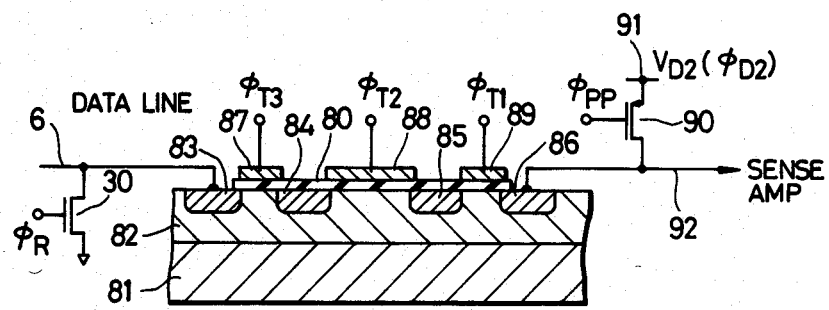
FIG. 6 is a sectional view of an embodiment of the BCT amplifier.
Figure 9:
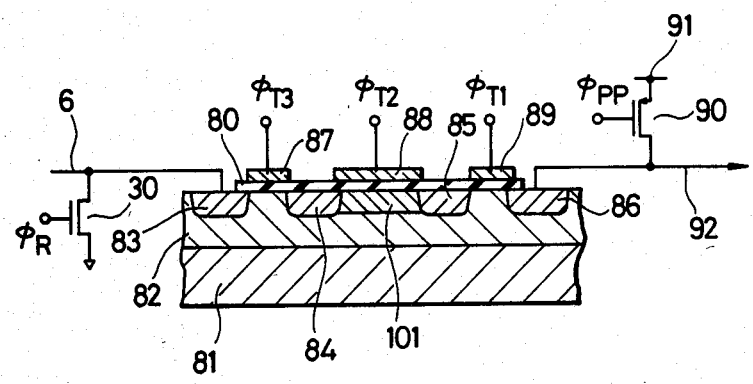
FIG. 9, FIG. 10, FIG. 25 show sectional views of other embodiments of a BCT amplifier.
Figure 10:
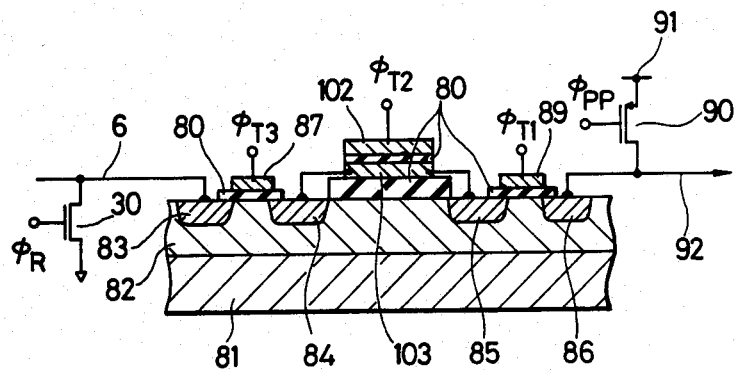

FIG. 6 is a sectional view of a BCT amplifier (bias charge transfer amplifier) which amplifies a minute signal of one level appearing on the data line up to such a voltage as can be sensed by the sense amplifier 33 consisting of the MOS transistor circuits. FIGS. 7(A) and 7(B-1) to 7(B-5) show drive pulse timings and potentials. FIGS. 8(A) and 8(B-1) to 8(B-5) show pulse timings and potentials indicating another driving method. FIG. 9 and FIG. 10 show the embodiments of the BCT amplifier.

In FIG. 6, 80 is an insulating film; 81 is an N type semiconductor substrate; 82 is a P-type well region; 83–86 are n+ layers; 87, 89 are charge transfer gates; 88 is a charge driving gate; 90 is a precharge gate; 92 is a sense amplifier input terminal.

Operations of the BCT amplifier are explained by referring to FIG. 6 and FIGS. 7(A) and 7(B-1) to 7(B-5).

First, the reset gate 30 is set to the conductive state (ON state) by the reset pulse $\phi_R$, resetting the data line 60 to 0 V or a sufficiently low voltage. Next, after the gate 30 is set to non-conductive state (OFF state), the gates 87–89 and 90 are set to the ON state and the potential of data line 6 is set to $V_{D0}=V_{T3H}-V_{ThT3}$ (FIG. 7(B-1)). Here, $V_{T3H}$ is a high level voltage of the pulse applied to the gate 87, $V_{ThT3}$ is a threshold voltage (including substrate effect) of the gate 87. The gates 87–89 are then set to the OFF state and a bias charge stored under the drive gate 88 is also set (FIG. 7(B-2)). At this time, the signal charge carrier of storage capacitor 2 is read on the data line through the word gate 3 (93 of FIG. 7(B-2)). Then the gate 87 is set to ON state and the bias charge at the lower part of drive gate 88 is moved to the side of data line 6 (FIG. 7(B-3)). A capacitance ($C_D$) of data line 6 is considerably large among the node capacitances within the apparatus and often takes an order of PF. But, a capacitance of drive gate 88 is very small as compared with it. Therefore, the drive charge is mostly moved to the side of data line. At this time, a bias charge mixes with signal charges. Next, the drive gate 88 is set to ON state and such mixed charges are fetched to the lower part of drive gate 88 (FIG. 7(B-4)). Moreover, the transfer gate 87 and drive gate 88 are set to OFF and charges are transferred to the input end side 92 of sense amplifier 92 (FIG. 7(B-5)). At this time, a voltage is applied to the gates 87–89 in the same condition as (B-2) and the bias charge is not transferred and only the signal charge is transferred as 94–95.

The drive pulse timing is shown in FIG. 7(A). Said bias charge transfer process is repeated for a number of times corresponding to a number of levels 9 (for example, 4 times in the case of four levels) for multiple level data reading. Namely, in the example of FIG. 2, the bias charge transferf is carried out once during the timing $t_1$–$t_2$ and the timing $t_2$–$t_3$ respectively. Such repetition may be allowed during the timing $t_{23}$–$t_{28}$ as shown in FIG. 7(A) or may be allowed during the timing $t_{21}$–$t_{28}$, except for the reset time of data line. During the latter timing, the bias charge under the drive gate 88 is reset in each timing and therefore when reading is conducted many times, the bias charge transfer can always be done with high accuracy by preventing that the charges are reduced by a tailing current of the gate T1 (89).

Here, a minute charge $Q_s$ on a large capacitor $C_D$ can be efficiently moved to a small capacitor $C_1$ for the following reason.

Namely, the gate T3 (83) becomes cut-off state, a current usually does not flow under the gate T3 because a voltage amplitude is very small even when a minute signal appears on the data line as indicated by 93. It is because the gate T3 is in the tailing region at a very low level. However, when a bias charge is sent onto the data line, the operating point of tailing rises and a current which is as large as different order flows and for example, charges of about 99% move to the lower side of gate T2. In this charge, the signal charges of 99% are also included and when the bias charges are subtracted through the gate T1 (89), the signal charges can be moved to the sense amplifier input terminal 92 with a very good transfer efficiency.

In the above charge transfer, transfer of signal charges can be done for each gate under the saturated mode as indicated by FIGS. 7(B-4) and 7(B-5). If such transfer is carried out under the non-saturated mode, transfer of signal charges is not conducted sufficiently due to the division of capacitance.

FIGS. 8(A) and 8(B-1) to 8(B-6) show another driving method. This method is different from that shown in FIGS. 7(A) and 7(B-1) to 7(B-5) in such a point that the setting shown in FIG. 8(B-3) of bias charge and transfer of such bias charge to the sense amplifier input terminal 15 through the gate T1 (89) from the gate T2(88) are conducted under the condition that both T1 and T2 are ON. Thereby, the OFF level of each gate T1, T3 is simple cut-off state and it is not required to think of the conductive state of current. Thus, a low level setting of pulse can be done easily (in many case, it can be set to 0 V). Each reset of bias charge under the gate T2 described in the driving arrangement shown in FIGS. 7(A) and 7(B-1) to 7(B-5) is carried out by setting the terminal 91 to low level in FIG. 8(B-2). In case charges are transferred many times, operations are more stabilized by repeating the steps shown in FIGS. 8(B-2) to 8(B-6) ($t_{32}$-$t_{41}$). Here, the timing ($t_{40}$) for making the high level of the pulse $\phi_{T1}$ may be set to the timing $t_{38}$-$t_{39}$ as shown in FIG. 8(B-5) where the pulses $\phi_{T2}$ and $\phi_{T3}$ are high level as shown by 96. Thereby, even when the capacitance of gate T2 for the signal charges is small, the signal charges do not appear under the gate T2 and charges are set to the sense amplifier input terminal through the gate T1.

FIG. 9 shows another embodiment of structure of the BCT amplifier which is different from that of FIG. 6 in such a point that n− or n+ layer 101 is provided under the gate T2 (88). As is apparent from the potential diagrams of FIGS. 7(B-1) to 7(B-5) and FIGS. 8(B-1) to 8(B-6), it is better that the gate T2 (88) as the lowest threshold voltage $V_{ThT2}$ among those of the gates T1(89) and T3(87) and it is the depletion type. If it is the depletion type, the drive pulse $\phi_{T2}$ can be simplified as the maximum voltage ($V_{cc}$) of the OV system. When the threshold voltages of gates T1-T3 are considered as $V_{ThT1}$-$V_{ThT3}$, the gates T1-T3 can be driven with the drive pulse of high level, low level and equal amplitude as is obvious from FIG. 7(B-1), FIG. 8(B-1) when there are relations, $V_{ThT3} > V_{ThT1} > V_{ThT2}$, $V_{ThT2} < 0$ V, ($V_{ThT1} < 0$ V). In case 101 is the n+ type, the gate T2 becomes only a simple capacitor, but as is apparent from the operation principle of FIGS. 7(A) and 7(B-1) to 7(B-5) and FIGS. 8(A) and 8(B-1) to (B-6), the same effect as that obtained when the gate T2 is a MOS transistor can also be obtained.

FIG. 10 is an embodiment where the gate T2 is considered as a capacitance (formed by the electrodes 102 and 103) on the field by considering it as only a simple capacitance. Thereby, the processing for providing the n− or n+ layer under the gate T2 is no longer necessary and the manufacturing process can be matched with that for ordinary memory LSI.

If the gate T2 is formed as the enhancement type, when the low level of drive pulse $\phi_{T2}$ is set to 0 V, recoupling of electron and hole pair occurs through the surface level at the semiconductor surface under the gate and charge transfer efficiency is deteriorated. But it can be prevented by setting low level of $\phi_{T2}$ to a value higher than $V_{Th2}$ or by applying a negative bias to the well 82.

In the embodiments of FIG. 9 and FIG. 10, such phenomenon does not occur and the low level of $\phi_{T2}$ can be set to 0 V.

Figure 25:
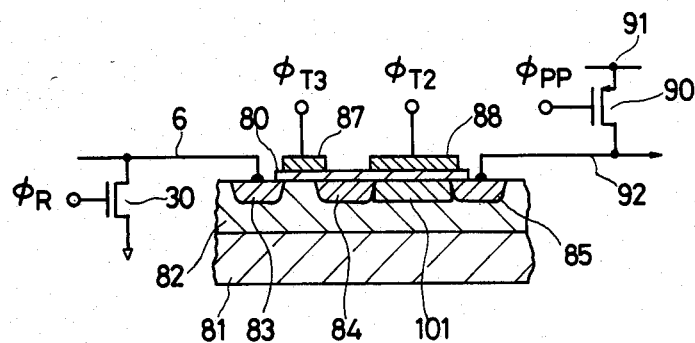

FIG. 25 shows an embodiment indicating another structure of the BCT amplifier which is different from the preceding embodiment in such a point that the gate T1 is eliminated. In this case, the bias charge under the gate T2 (88) is given by a voltage to be applied to the terminal 91 through the precharge gate. When the pulse $\phi_{T2}$ is set to low level, the bias charge is sent and it is set to high level again. Thereby, it is obtained together with the signal charage, as in the case of the preceding embodiment. At this time, the bias charge and signal charge are sent to the sense amplifier while these are mixed and these are judged. Since the input capacitance of the sense amplifier becomes large, the amplification coefficient is not so large but structure can be simplified.

Figure 11:
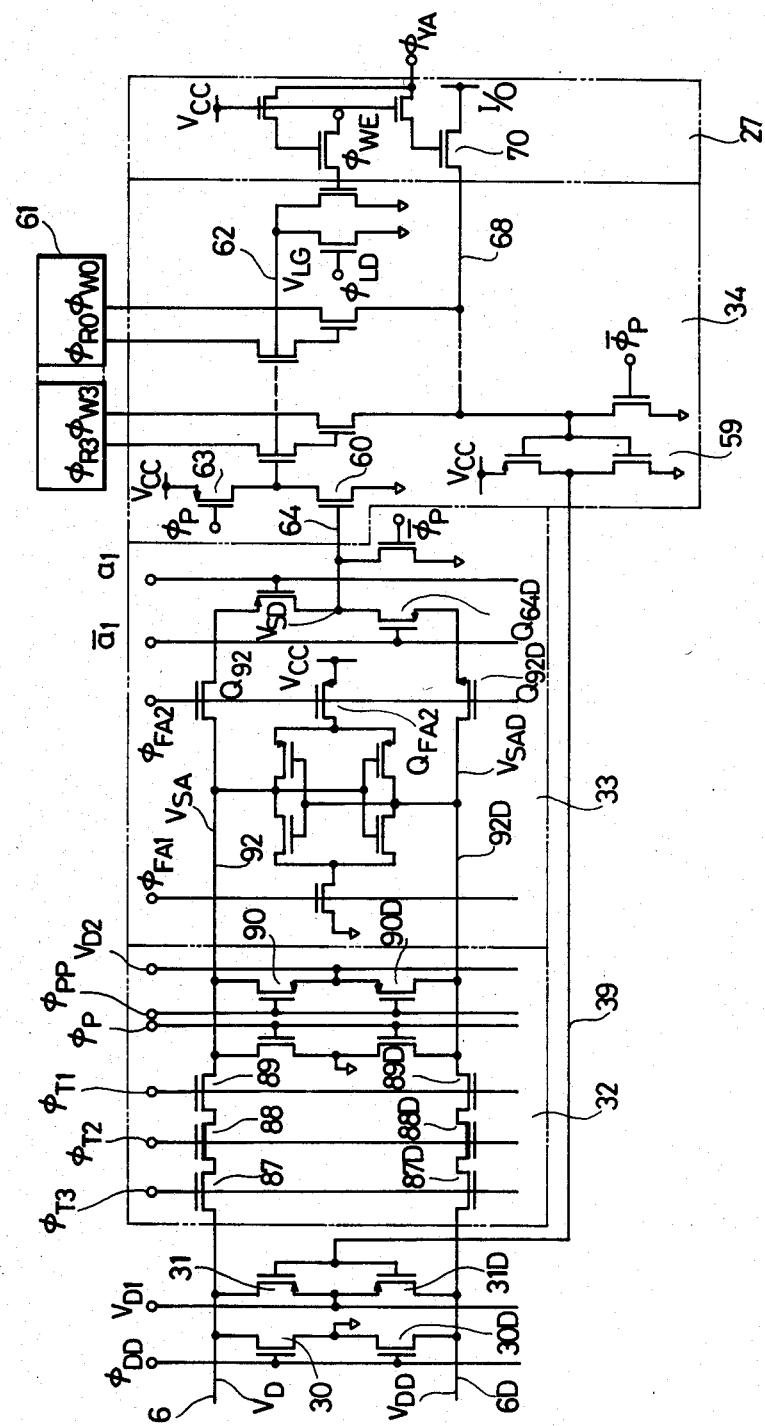
FIG. 11 shows an embodiment of the signal sense circuit of the present invention.
Figure 12:
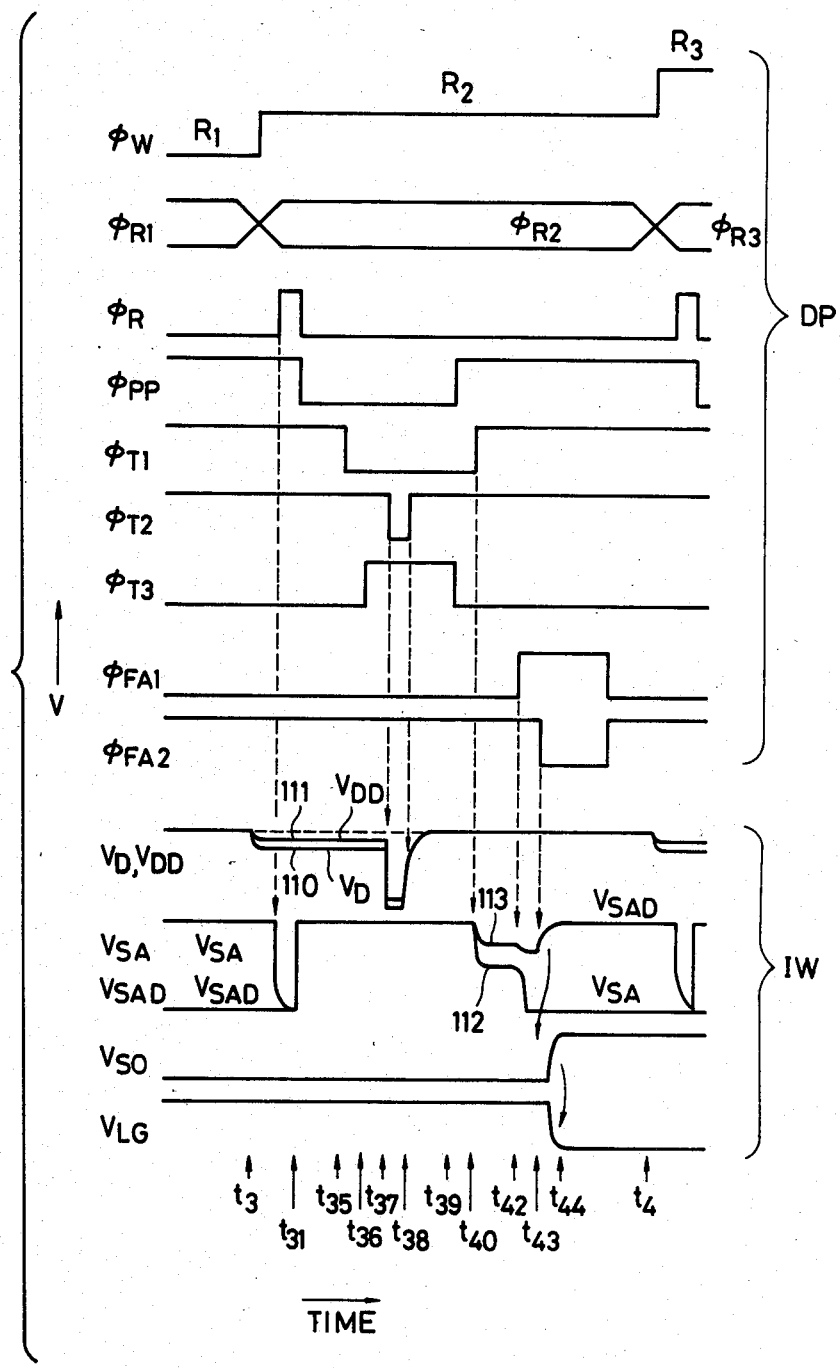
FIG. 12 shows drive pulses and internal waveforms used in FIG. 11.

FIG. 11 shows a practical example of circuit structure of the signal sense system as a whole of the MLS memory of the present invention. FIG. 12 shows the drive pulse waveforms and internal waveforms. In these figures, the elements given the same symbols such as 32, 33, 34, 27, 61, $t_3$, $t_4$, $t_{31}$-$t_{41}$, etc. indicate the same elements and timings, etc.

The timing waveforms shown in FIG. 12 indicate the condition that the data "2" is just stored in the memory cell and it is then extracted, considering the case where the cell connected to the data line 6 is selected at a the memory cell and dummy data (in such an amount equal to ½ of signal charge) appears from the side of data line 6D. In such figure, DP is a drive pulse and IW is an internal waveform.

When a voltage ($\phi_W$) of the word line rises to the level "2" ($t_3$) from the levl "1" (R1), charges are read on the data lines 6, 6D as indicated by 110, 111. Here, a signal charge obtained by a single operation is considered as $Q_s$, a dummy cell has the capacitance $C_D$ which is ½ of the memory cell capacitance $C_s$, it is reset to 0 V by the reset gate 19 (FIG. 1) prior to the read operation period. Since the pulse $\phi_W$ is applied to the dummy word line 15, charges equal to $Q_s/2$ are sent each time to the data line 6D for each rise of one step of word line voltage from the dummy cell. Meanwhile, since the signal charge $Q_s$ appears on the data line 6, a voltage of data lines 6, 6D is lowered respectively as much as indicated below when the data line capacitance is considered as $C_D$.

$$\Delta V_D = Q_s/C_D, \Delta V_{DD} = (\tfrac{1}{2}) \times Q_s/C_D$$

During the timing $t_{37}$-$t_{39}$, the data line voltage $V_D$ and data line voltage of dummy data $V_{DD}$ return to the original voltages respectively due to the bias charge transfer and the signal charge and dummy charge are respectively sent to the sense amplifier input terminals 92, 92D ($t_{38}$-$t_{42}$).

Prior to this operation, the voltages $V_{SA}$, $V_{SAD}$ of sense amplifier input terminals 92, 92D are precharged to $V_{D2}$ (it may be equal to $V_{cc}$) by the pulse $\phi_{PP}(t_{31}$-$t_{39})$ and when the gate T1 (89) becomes ON at the timing $t_{40}$, voltage drop by said signal charge and dummy charge appears (112, 113; $t_{40}$-$t_{42}$).

When the pulse $\phi_{FA1}$ turns ON at the timing $t_{42}$, the flip-flop type (hereinafter referred to as FF type) sense amplifier starts, a voltage $V_{SA}$ is dropped to low level (0

V) and $V_{SAD}$ is also dropped ($t_{42}$–$t_{43}$). Next, when the pulse $\phi_{FA2}$ becomes low level, the P-channel MOS transistor $Q_{FA2}$ becomes conductive, raising $V_{SAD}$ to $V_{cc}$ and the judging operation of the sense amplifier is defined ($t_{43}$–$t_{44}$). Since the pulse $\phi_{FA2}$ makes conductive $Q_{92}$, $Q_{92A}$, an output of the sense amplifier is sent to the column register. The pulses $a_1$, $\bar{a}_1$ determine to which line of a pair of data lines 6, 6D the signal charge and dummy charge are output. In this example, the pulse $a_1$ is high level, while the pulse $\bar{a}_1$ is low level. Accordingly, $V_{SAD}$ defined to be high level raises a voltage $V_{SO}$ of node 64 through the transistor $Q_{64D}$ and thereby a voltage $V_{LG}$ of read gate 62 is also raised ($t_{43}$–$t_{44}$). At this time, since the output $\phi_{R2}$ of the shift register is in the high level, a high level voltage is stored at the source end (65 of FIG. 4) of the read gate as in the case of FIG. 4 and the multiple level data can be read. This data can be read to the external circuit, refreshed and written externally as explained with reference to FIG. 4 and FIG. 5.

The FF type sense amplifier shown as 33 in FIG. 11 has the input dynamic range as wide as $V_{cc}$ to 0 V and quickly amplifies the signal, owing to the positive feedback. As described later (FIG. 17), the signal appearing on 92, 92D easily has the offset due to the characteristic of the BCT amplifier. Therefore, wide input dynamic range is just suited for the MLS memory of the present invention and accordingly more reliable operation of the sense system of MLS memory can be obtained.

Figure 13:
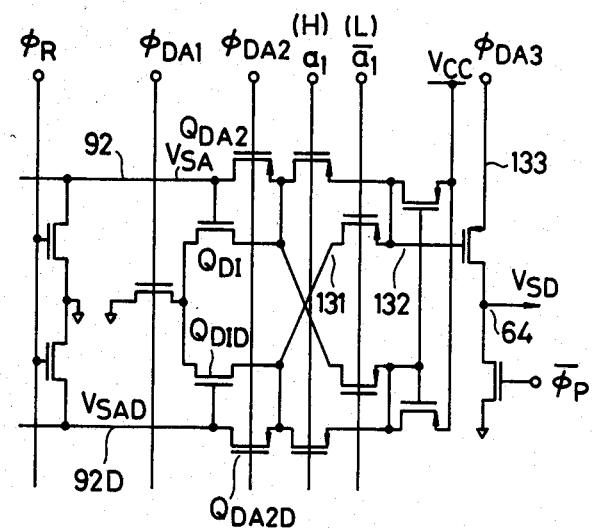
FIG. 13 shows a circuit diagram of a sense amplifier of another embodiment of the present invention.
Figure 14:
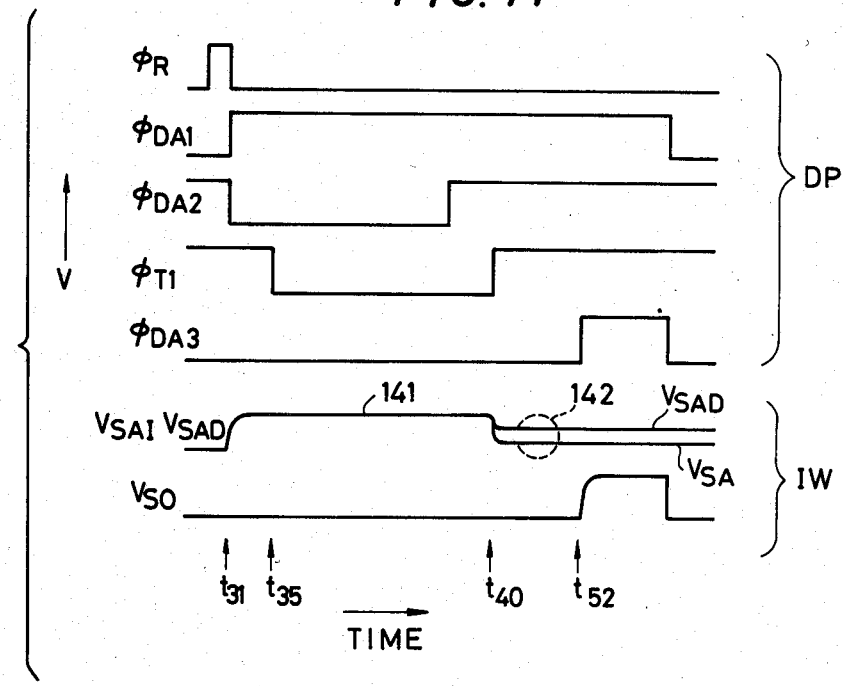
FIG. 14 shows drive pulses and internal waveforms used in FIG. 13.

FIG. 13 shows a differential type high sensitivity amplifier as another embodiment of sense amplifier of the present invention. FIG. 14 shows drive pulse timings and internal waveforms.

After the voltages $V_{SA}$ and $V_{SAD}$ of 92, 92D are lowered to 0 V by the pulse $\phi_R$, the pulse $\phi_{DA2}$ is set to low level. Thereby, $V_{SA}$, $V_{SAD}$ are precharged to high level ($t_{31}$–$t_{35}$) through $Q_{DA2}$, $Q_{DA2D}$ ($a_1$ is high level and $\bar{a}1$ is low level). In this example, $\phi_{T1}$ is set to high level and bias charge under the gate T2 is set at this time. In this precharging process, the drain to gate of differential input transistors $Q_{DI}$, $Q_{DID}$ becomes conductive. Therefore, offset by dispersion of threshold voltage between these transistors can be compensated and a very sensitive sense amplifier can be realized. In case the transistors $Q_{DI}$, $Q_{DID}$ have dispersion of threshold voltage $\Delta V_T$, the precharge level 141 of $V_{SA}$, $V_{SAD}$ is a value which is different by only $\Delta V_T$.

The timing $t_{35}$–$t_{40}$ means the period where the bias charge transfer already described is carried out. When $\phi_{T1}$ becomes high level at the timing $t_{40}$, the signal charge and dummy charge respectively appear on 92 and 92D and these are judged by the sense amplifier. In case signal charge appears on 92, $V_{SAD}$ becomes higher than $V_{SA}$ ($V_{SAD} > V_{SA}$) (142) and the node 131 is lowered to low level. Since the pulse $\bar{a}_1$ is low level, it is transferred to the gate 132 of transistor $Q_{DA3}$ and the pulse $\phi_{DA3}$ is raised to high level ($t_{52}$). Thereby, the column register is started. When signal charge is not generated on 92, $V_{SAD}$ becomes lower than $V_{SA}$ ($V^{SA}_D < V^{SA}$). Accordingly, the node 131 is high level and $V_{SO}$ remains at low level.

The terminal 133 is not connected to $V_{cc}$ and the pulse $\phi_{DA3}$ is applied thereto because it must be prevented that the output $V_{SO}$ sometimes rises even when data is not actually applied while pulse noise enters to each node due to ON-OFF of drive pulse and it is amplified up to such a degree as appearing at 132. Thereby, a highly sensitive amplifier which is resistive to noise can be realized and reliable operation of the sense system of the MLS memory which generally allows a large noise component to enter can be attained. This differential sense amplifier is capable of reducing an input capacitance because only one gate of transistors $Q_{DI}$ and $Q_{DID}$ is respectively coupled to the input terminals 92, 92D and is easily raising the amplification coefficient of the BCT amplifier.

Figure 15:
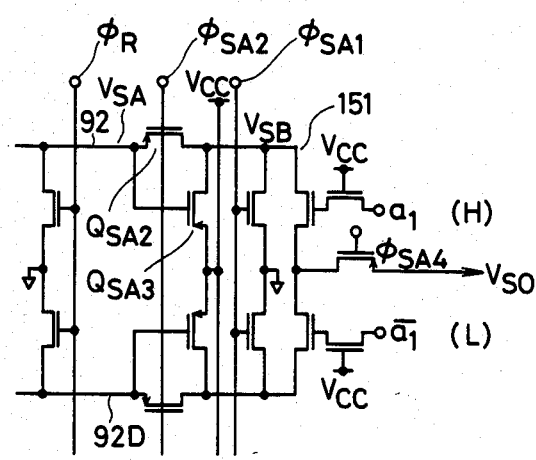
FIG. 15 shows a circuit diagram of sense amplifier of the other embodiment of the present invention.
Figure 16:
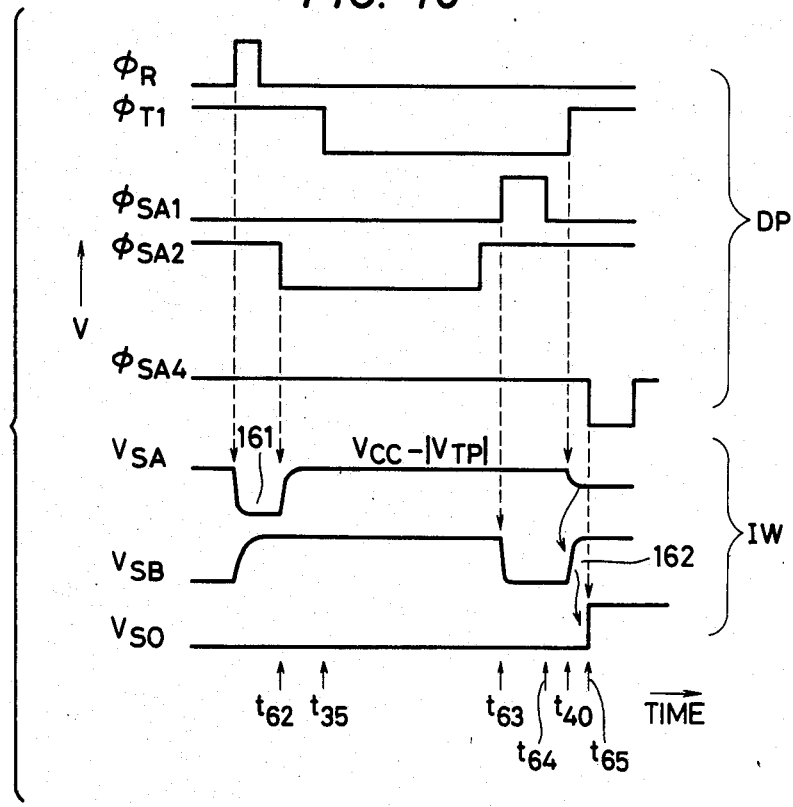
FIG. 16 shows drive pulses and internal waveforms used in FIG. 15.

FIG. 15 is another embodiment of sense amplifier used in the present invention. FIG. 16 shows the drive pulse (DP) timings and internal waveforms (IW).

The sense amplifier shown in FIG. 15 is not differential type and the dummy charge is not used for judgment. After the voltage $V_{SA}$ of 92 is lowered by the pulse $\phi_R$ (161), the pulse $\phi_{SA2}$ is set to low level and $V_{SA}$ is precharged to $V_{cc} - |V_{TP}|$ through $Q_{SA2}$, $Q_{SA3}$, where, $V_{TP}$ is a threshold voltage ($V_{TP} < 0$ V) of p-channel MOS transistor. At this time, $\phi_{T1}$ is set to high level and thereby a bias charge under the gate T2 is set ($t_{62}$–$t_{39}$). The timing $t_{35}$–$t_{40}$ is the bias charge transfer period. When $\phi_{T1}$ becomes high level at the timing $t_{40}$, signal charge appears on 92. Prior to this process, $\phi_{SA1}$ is set to high level and voltage $V_{SB}$ of 151 is set to 0 V ($t_{63}$–$t_{64}$). $V_{SA}$ is set to $V_{cc} - |V_{TP}|$, namely to a voltage which just sets $Q_{SA3}$ to the cut-off state. Therefore, $Q_{SA3}$ becomes conductive ($t_{40}$) with a minute signal charge and $V_{SB}$ is raised to high level (162). An output can be obtained at $V_{OS}$ by sampling $V_{SB}$ with $\phi_{SA4}$ ($t_{65}$).

The sense amplifier of FIG. 15 has the characteristic that it can be realized with comparatively less transistors and is suited to high integration.

Figure 17:
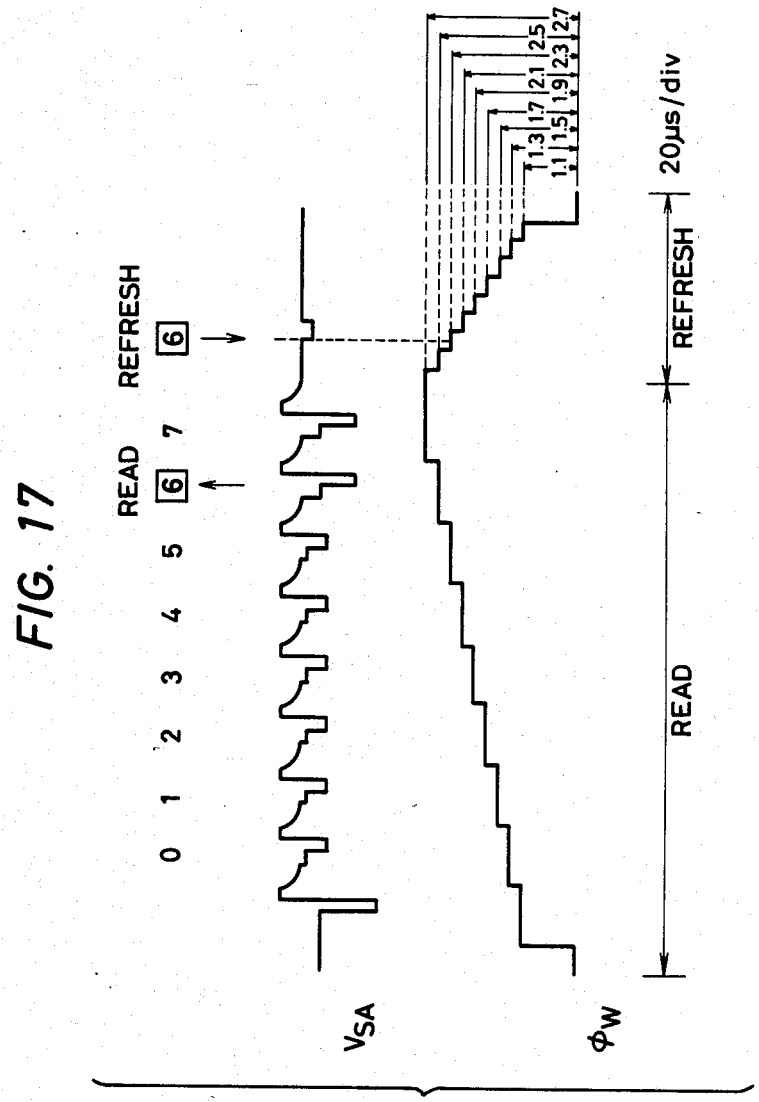
FIG. 17 shows operation waveforms of the present invention.

FIG. 17 shows internal waveforms to be used for actual MLS memory operation of 8-level(3-bit)/cell in the embodiment of the present invention shown in FIG. 1.

In this figure, the lower stage indicates a voltage $100_W$ applied to the word line and the upper stage indicates a voltage ($V_{SA}$) at the point of 92 in FIG. 1. Namely, it is a voltage waveform at the bias charge transfer amplifier output terminal (sense amplifier input terminal). In this example, the data stored in the level "6" ("110" in the binary data) is read together with the ascending pulse and it is then written to the level "6" by the descending pulse. As is shown in the figure, one step of $\phi_W$ means 200 mV and therefore one step of signal voltage of memory cell is about 200 mV. On the data line, such voltage is about 15 mV and it is amplified by BCT amplifier up to about 10 times and thereby an output as high as 150 mV can be obtained.

As is understood from FIG. 17, even when signal charge does not appear ("0"–"5"), $V_{SA}$ drops a little. This is because the BCT amplifier is accompanied by various kinds of noise and it is more practical from the point of view of high accuracy to judge the signal with the sense amplifier which is used for comparing difference of dummy charges. In other words, in the MLS memory of the present invention, the signal can be sensed more easily by comparing it with the dummy charge sent from the dummy cell.

As the peripheral circuit of MLS memory of the present invention shown in FIG. 1, for example, the address select circuits 24, 28 which are the same as those in the existing memory may be used.

In the MLS memory of the present invention as shown in FIG. 4, conversion (equivalent to A/D, D/A conversion) between multiple level data and binary data can be realized with only a very small scale circuit by setting input and output of data as explained below.

Namely, the multiple level data read to the storage node (65 etc.) of the column register from the memory cell is read to the common input-output line (I/O line; FIG. 4) as the timing signal being synchronized with the pulses ($\phi_{W0}$, $\phi_{W1}$), . . . ) sent from the shift register 61 and external data is also written by sending the timing signal corresponding to the multiple level from the I/O line in the same way. Accordingly, it is desirable to provide an encoder which receives such timing signal and converts the data into binary data [$D_0$] and a decoder which converts the externally input binary data [$D_i$] into the timing signal as the input-output circuits 28.

Figure 18:
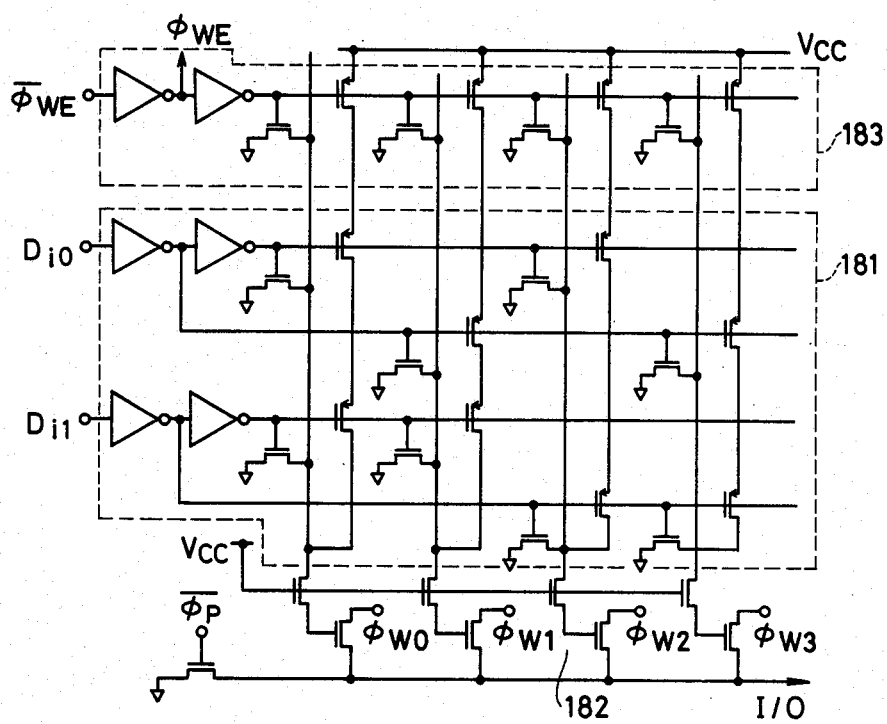
FIG. 18 and FIG. 19 show circuit diagrams of decoder and encoder of an embodiment of the present invention.
Figure 19:
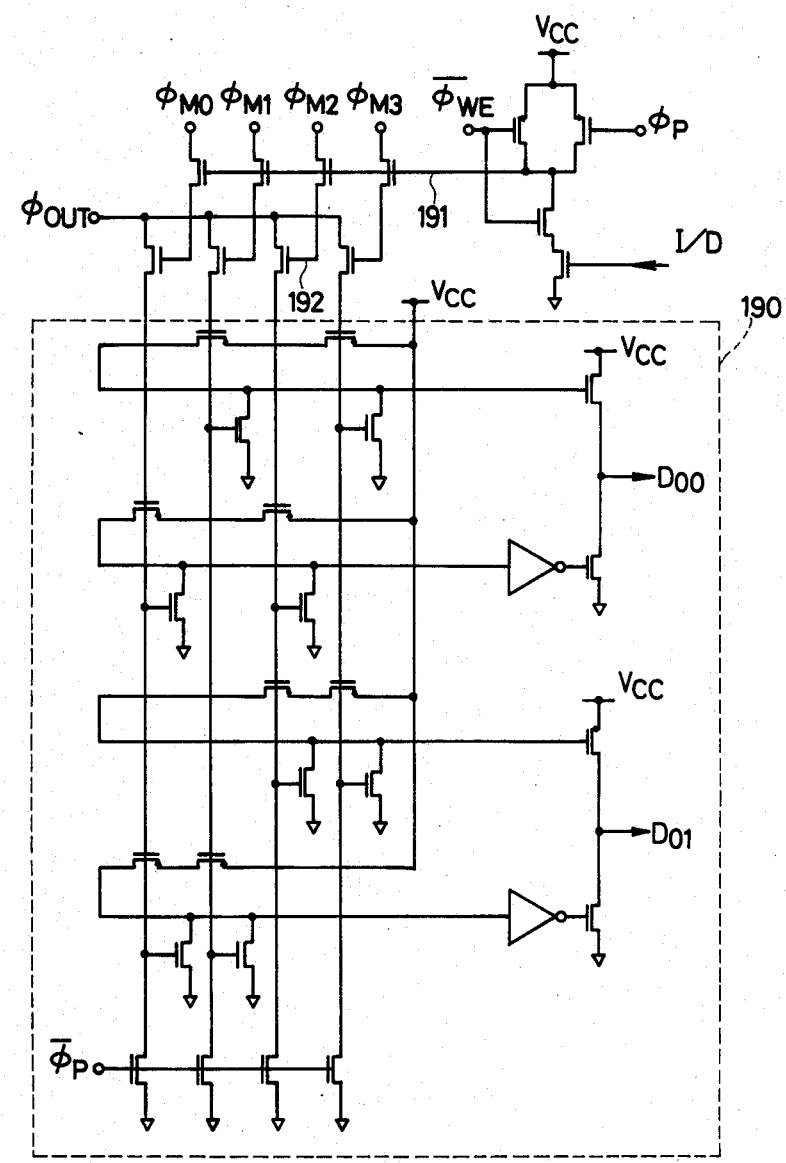
Figure 20:
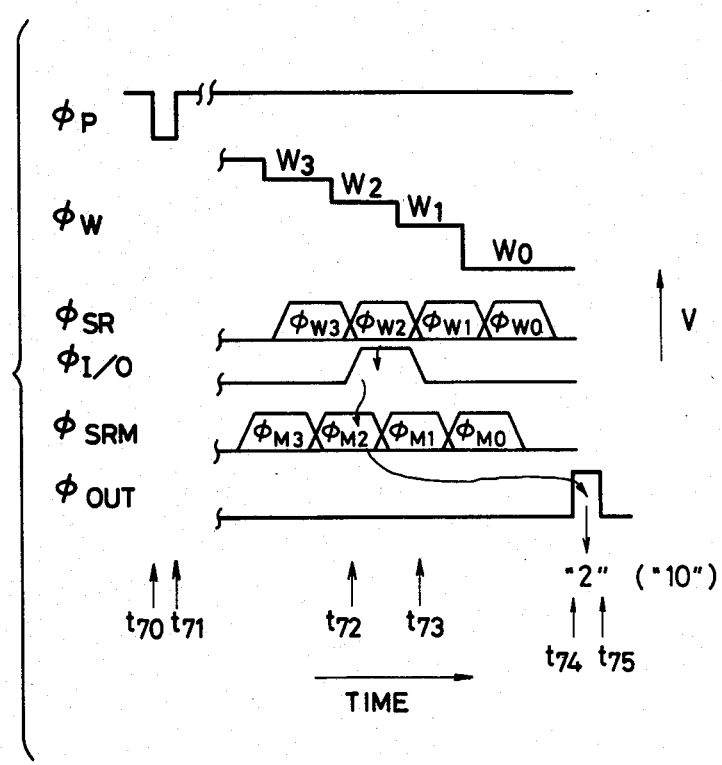
FIG. 20 shows timings of drive pulses used for the encoder shown in FIG. 19.

FIG. 18 and FIG. 19 respectively show the embodiments of the decoder and encoder which have realized said input-output circuits. FIG. 20 shows the drive pulse timing chart of the encoder shown in FIG. 19.

Operations of the embodiment of the decoder shown in FIG. 18 are as follow. For example, when the data ($D_{i1}$, $D_{i0}$)=(10) is entered, high level appears at the node 182 of the corresponding multiple level "2" by the specific logic circuit 181 and others are kept at low level. Next, when pulses $\phi_{W0}$, $\phi_{W1}$, . . . sent from the shift register are sequentially applied, the I/O line is raised to a high level by $\phi_{W2}$ and therefore the level "2" is stored in the memory cell by starting the writing gate 31 (FIG. 1) at this timing. When $\phi_{\overline{WE}}$ is in the high level, an input is inhibited by the R/W select circuit 183 and thereby a signal does not appear on the I/O line.

Operations of the embodiment of the encoder shown in FIG. 19 are as follow.

With reference to FIG. 20, the node 191 is precharged to $V_{cc}$ by the pulse $\phi_P$ at the timing $t_{70}$-$t_{71}$. When $\phi_{\overline{WE}}$ is high level, it is kept at $V_{cc}$. Next, the pulses $\phi_{M3}$, $\phi_{M2}$, . . . are sequentially applied as shown in FIG. 20, prior to the pulses $\phi_{W3}$, $\phi_{W2}$, . . . sent from the shift register. For example, in case the level "2" is read, the voltage $V_{I/O}$ of the I/O line rises at the timing of $\phi_{W2}$ ($t_{72}$-$t_{73}$). Thereby, a voltage of node 191 is dropped and therefore the node 192 being set at the high level by the $\phi_{M2}$ is then held (temporarily stored) at a high level. When $\phi_{OUT}$ is set to high level after the pulses $\phi_{SR}$, $\phi_{SRM}$ circulate once ($t_{74}$-$t_{75}$), the output ($D_{01}$-$D_{00}$)=(10) can be obtained by the specified logic circuit 190. The input and output of the data of MLS memory of the present invention can be easily realized with a simplified small scale circuit and an MLS memory just suited to practical use can be realized by providing a timing sensing and generating circuit which is synchronized with the pulse sent from the shift register for temporary storing between the ordinary encoding and decoding logic circuit and I/O line.

As is already explained, the signal charges are inevitably reduced in accordance with a number of levels in order to obtain high integration density characteristic of the MLS memory. From the point of view of sensing the signals, such difficulty has been solved by voltage amplification of the bias charge transfer amplifier having a high efficiency as explained above. However, in the memory cell, noise charges are generated by a heat generating current $J_{GR}$ and a signal to noise ratio (S/N) for it is also deteriorated as much when a number of levels increases. Such phenomenon does not give any problem under the normal temperature, but, since $J_{GR}$ increases exponentially for temperature (it is supposed that $J_{GR}$ increases in the order of about one digit when temperature rises 30° C. around the normal temperature), it results in a particular problem in operations at a high temperature of MLS memory.

Figure 21:
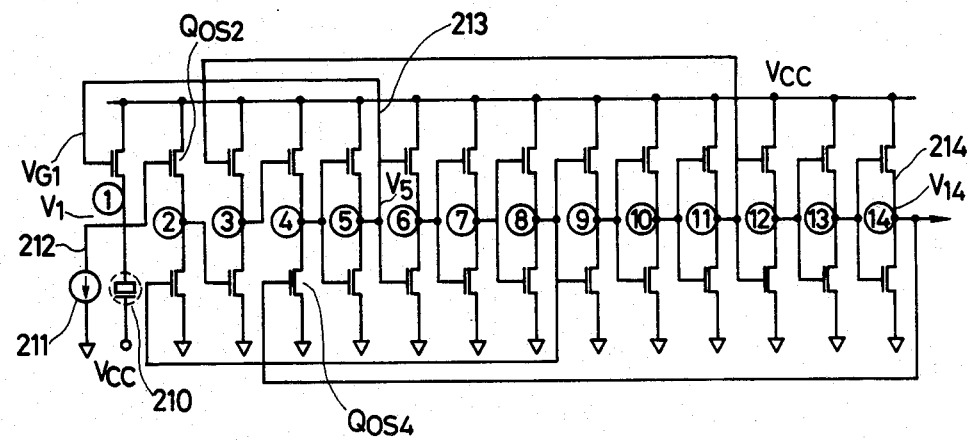
FIG. 21 shows a circuit diagram of triggering pulse generator of an embodiment of the present invention.
Figure 22:
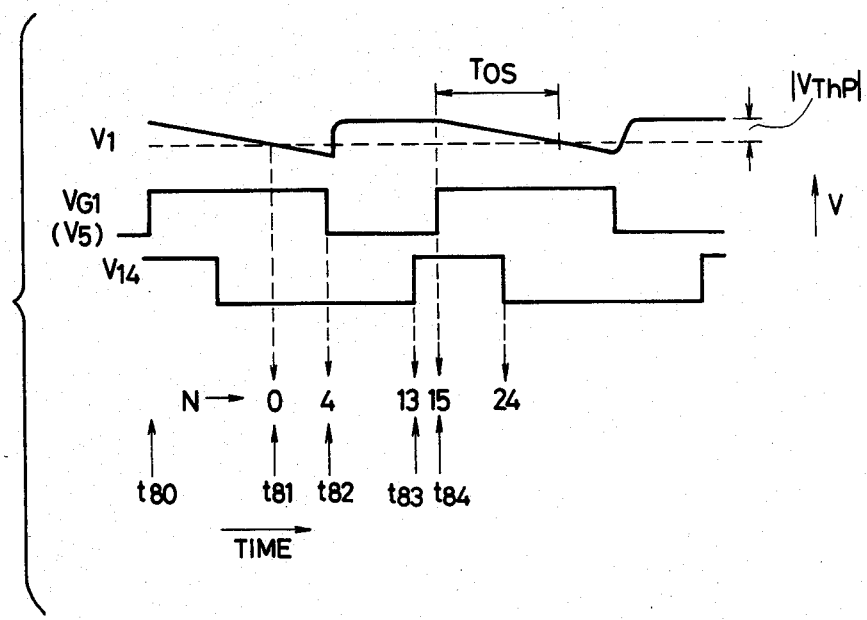
FIG. 22 shows internal waveforms in FIG. 21.

FIG. 21 shows an embodiment of circuit structure of triggering pulse generator 35 invented in view of solving problems mentioned above, and FIG. 22 shows internal waveforms.

A pulse generator shown in FIG. 21 increases the oscillation frequency as much as an increase of the heat generating current (hereinafter referred to as a leak current) due to a temperature rise and thereby the refresh period of the memory cell can be shortened and destruction of multiple level data by leak current can be prevented.

A pulse generator 210 shown in FIG. 21 comprises a pseudo memory cell similar to memory cell. When the data stored therein is attenuated by the leak current 211 and the inverter circuit connected thereto is started.

First, $V_{G1}$ is in the low level and $V_1$ is precharged to high level. Thereafter, when it is set to high level ($t_{80}$), a voltage $V_1$ of node 212 is discharged by the leak current. When $V_1$ becomes lower than $V_{cc} - |V_{ThP}|$ ($t_{81}$), the transistor $Q_{OS2}$ becomes conductive and the inverter is sequentially reversed. When reverse operation advances up to the node 213, $V_s$ ($V_{G1}$) is dropped to the low level and $V_1$ is precharged again to the high level ($t_{82}$). When the reverse operation advances up to the node 214, $V_{14}$ becomes high level, giving an output ($t_{83}$). Moreover, such output is fed back to $Q_{OS4}$, reverse opeations are continued and $V_s$($V_{G1}$) is raised up to the high level. At this time, the node 212 discharges ($t_{84}$). It is obvious that the period of $T_{OS}$ depends on the leak current $J_{GR}$ and the pulse generator where frequency increases when $J_{GR}$ increases due to the temperature rise can be obtained. $V_{ThP}$ is a threshold voltage of $Q_{OS2}$ and a value of N in FIG. 22 indicates a number of stages of inverters counted from the node 212.

Figure 23:
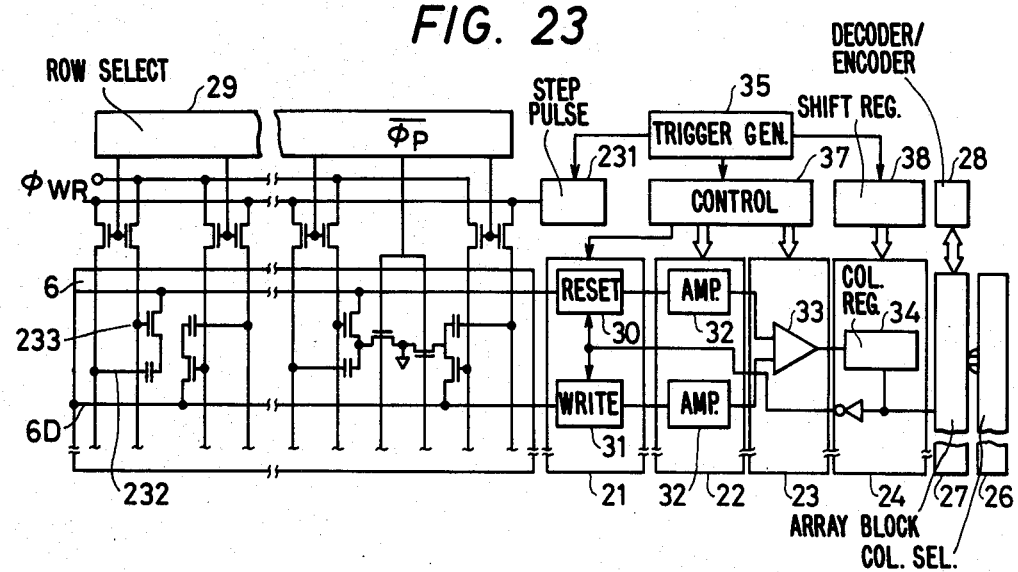
FIG. 23 shows another embodiment of the present invention.
Figure 24:
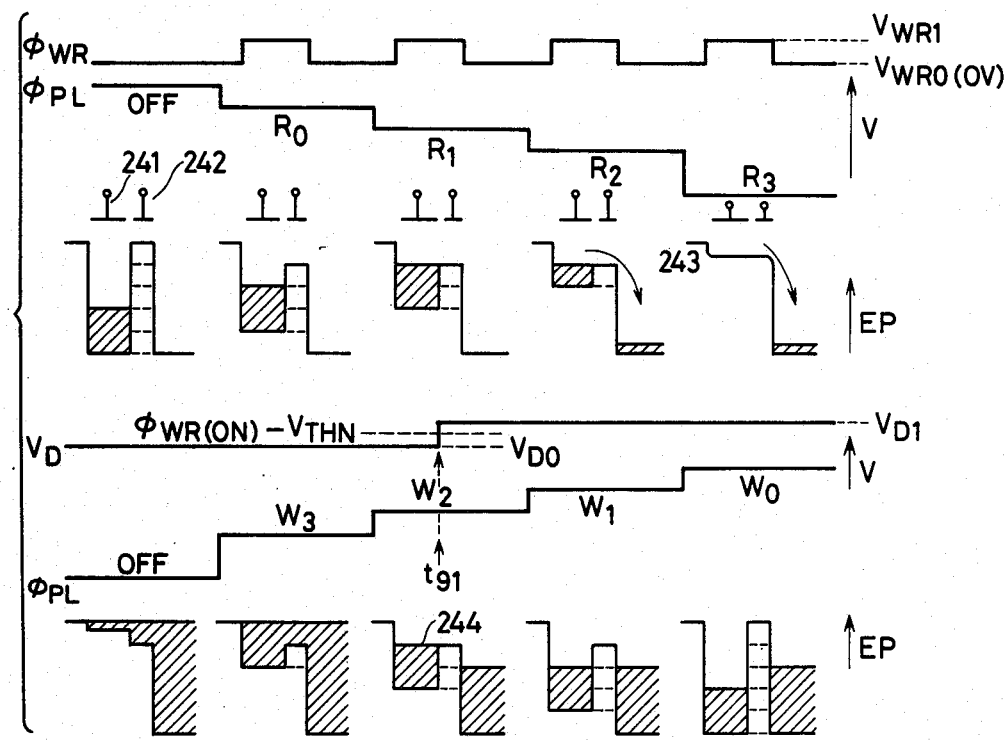
FIG. 24 shows drive pulses used in FIG. 23.

FIG. 23 shows another embodiment of the present invention and FIG. 24 shows the operation principle. The same symbols as those in FIG. 1 show the portions having the same function.

In the embodiment of FIG. 23, the stepping waveform sent from the stepping pulse generator 231 is stored in the storage capacitor electrode (hereinafter called a plate) 232 ($\phi_{P2}$) of the memory cell and as shown in FIG. 24, the descending stepping pulse is applied for reading operation while the ascending stepping pulse for writing operation, respectively. The pulse $\phi_{WR}$ applied to the word gate 233 is an ordinary binary pulse but its high level (ON state) is set to a voltage $V_{WR1}$ ($<<V_{cc}$) which is a little higher than the threshold volage of word gate.

Here, it is supposed that the level "2" is stored, the bottom of electron potential of the storage capacitor 24 sequentially ascends with sequential descending of $\phi_{PL}$ such as OFF—$R_0$—$R_1$— . . . , the signal flows toward the data line at the timing of R2 (243), it is judged by the signal sensing systems 22, 23 and is then read through the column register 34.

On the contrary, in case the level "2" is to be written, for example, the data line voltage is set to a voltage which is a little higher than $\phi_{WR}-\phi_{ThN}$ ($V_{ThN}$ is a word gate voltage) in place of 0 V when $/_{PL}$ reaches the level of $W_2$ ($V_{D1}<<V_{cc}$) ($t_{91}$). Thereby, charges corresponding to the level "2" remain in the memory cell (244) and are stored therein.

The embodiment shown in FIG. 23 and the driving method of FIG. 24 are characterized by the fact that since it is not required to raise the data line to $V_{cc}$ from 0 V at the time of writing opeation, power consumption due to the charging and discharging of data line during writing operation is small and rise of word gate voltage due to the coupling between the word line 233 and data line 6 can be kept very small. However, different from the case where a stepping pulse is applied to the word line (FIG. 1), the plate is not used in common for all cells but it is separated for each cell by the word and accordingly cell array has a little larger area. Moreover, the terminal 40 of writing gate 31 (FIG. 1) is not set to $V_{cc}$ but to the specified voltage $V_{D1}$ $(>/_{WR}(ON)-V_{ThN})$.

In the embodiment shown in FIG. 23, the maximum charges $Q_s$ of one memory cell is set to almost equal to the charges $Q_s'$ of DRAM of only the ordinary binary data in order to obtain practical merit of MLS memory, namely a high integration density. Therefore, the signal charge $Q_{s/N}$ per level divided into (N) multiple level is very small and it is difficult to directly sense a voltage appearing on the data line 6 with the sense amplifier consisting of the MOS transistor. Such voltage can be sensed actually by the BCT amplifier of the present invention. On the contrary, it is very difficult from the point of view of integration density to provide the A/D, D/A converter of multiple level data after the BCT amplifier. Therefore, it is very effective for realizing a MLS memory of super high integration density and low power consumption to set the integration density of memory cell equal to that of an ordinary DRAM and alleviate a load of the BCT amplifier by lowering the transfer coefficient thereof by extracting multiple level as the timing signal with the memory cell and treating signal charge itself as a digital value. Namely, multiple level data stored in the memory cell is extracted as the timing signal by applying a stepping waveform and it is then stored in the column register. Moreover, the A/D, D/A conversion system wherein multiple level data is written by the timing signal into the memory cell to which the stepping waveform is applied and an MLS memory which is also important like the BCT amplifier and is practical through combination of them have been realized.

Figure 26:
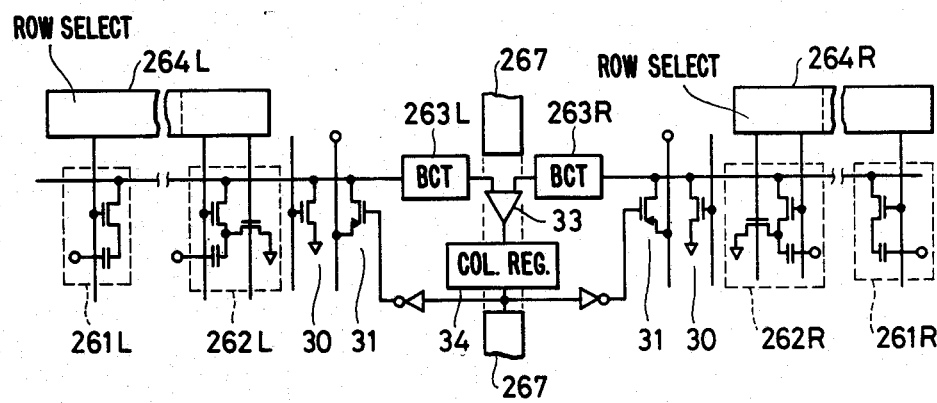
FIG. 26 shows a circuit diagram of another embodiment of the present invention.

The embodiments of the present invention described above employ the data line structure of folded bit line type as the memory structure shown in FIG. 1, FIG. 11 and FIG. 23 The present ivention can also be adapted to the data line structure of open bit line type as shown in FIG. 26.

FIG. 26 shows an embodiment of the MLS memory of the present invention employing the open bit line type data line structure. The elements given the same numbers indicate the same elements. 261L, 261R are memory cells; 262L, 262R are dummy cells; 263L, 263R are bias charge transfer amplifiers (BCT amplifier); 264L, 264R are row address select and buffer circuits; 267 is an input-output circuit array and column address select gate block.

When a memory cell 261L is selected, a dummy cell 262R is selected, the signal is respectively amplified by the BCT amplifiers 263L, 263R and is judged by the sense amplifier 33. After the signal is temporarily held by the column register 34, the signal is read through the input-output circuit 267. The writing operation is also carried out as in the case of the existing example. In the case of open bit line type, a memory having the general characteristic of this type, namely a memory having the performance that a high speed operation can be realized because the word line can be formed by the metal such as aluminium can be obtained.

In an embodiment of the present invention explained above, the signal is mainly compared using a dummy cell as shown in FIG. 1, FIG. 11, FIG. 23 and FIG. 26. Namely, the present invention can be adapted to the system where the sense amplifier not using the dummy signal shown in FIG. 15 is used. However, as explained above, since signal charges per level of MLS memory are reduced in order to increase integration density as compared with DRAM of 1-bit/cell, it is better to compare the signal using a dummy cell for the judgment with good S/N. The signal sent to the sense amplifier from the BCT amplifier often allows in each reading operation superposition of equivalent noise charges other than the signal charges due to the influence of pulse coupling or tailing current. In this case, the signal can be more easily and accurately judged using the signal $(Q_s/2N)$ sent from the dummy cell as is already explained regarding the internal waveforms of elements shown in FIG. 17.

In the BCT amplifier of the present invention, the signal flows only in the one direction and therefore since the column address select gate and column register are opposingly located to the memory array for the sense amplifier, the constitution of the folded bit line type is simpler than that of open bit line type.

The embodiment of the present invention described above is capable of further enhancing the effect thereof by the method, where the sense amplifier input terminals 93, 92D are divided, for example as shown in FIG. 11, by inserting a gate between the input terminal and BCT amplifier output terminal and thereby a coupling noise of pulse can be reduced.

An embodiment of the present invention partly uses the CMOS (complementary MOS) circuit and it can be formed only with the N or P channel MOS transistor. However, if it is formed only with a single polarity transistor, it is also followed by the general trend that power consumption increases.

The driving method explained for the embodiment of the present invention is particularly considered for obtaining sufficient effect of the present invention but such method is not limited only to it and other methods can also be adapted.

As explained above, the present invention provides an MLS memory for addressing by both rows and columns with a low power consumption comprising an amplifier which is just suited to a large capacity memory because of its simple structure and is capable of amplifying a minute voltage with a low voltage drive pulse and a high precision A/D, D/A conversion means which also has small scale circuit structure and can be driven with a low voltage in view of high integration density. Thereby, a semiconductor file memory having an ultra-high integration density which is expected for a small size computer system can be realized. Such semiconductor file memory fantastically improves a small size storage unit using semiconductor, for example, IC cards, etc.

The column register (temporary storage circuit) used in the present invention executes AD/DA conversion between multiple level signal and digital information and plays a very important function for an MLS memory.

In case of extracting information to the outside from the column register as shown in FIG. 4, reading is carried out serially in such a timing that the potential of input-output signal changes. Therefore, in the case of reading a multiple level data, for example, the data of 16 levels, the control signals /$w_0$/$w_{15}$ must sequentially be set to "H" level for each column and a longer time is required.

Accordingly, it is desirable to quickly read the data within a short period of time.

In order to meet such requirement, a device which is capable of quickly reading the data of multiple levels, if it is required to read the data from the column register of the MLS memory, is provided.

In order to attain such an object, a second group of storage cells is disposed corresponding to the group of memory cells in such a column register that the digital data corresponding to the timing of voltage change of input signal sent from the sense amplifier is written into the group of storage cells and the data stored in said groups of storage cells is read and it is then written into the memory cells. Moreover, provided is the means which writes the digital data corresponding to the timing of voltage change of said input signal into said second group of storage cells and data is read in parallel from the second group of storage cells in the selected columns.

Figure 27:
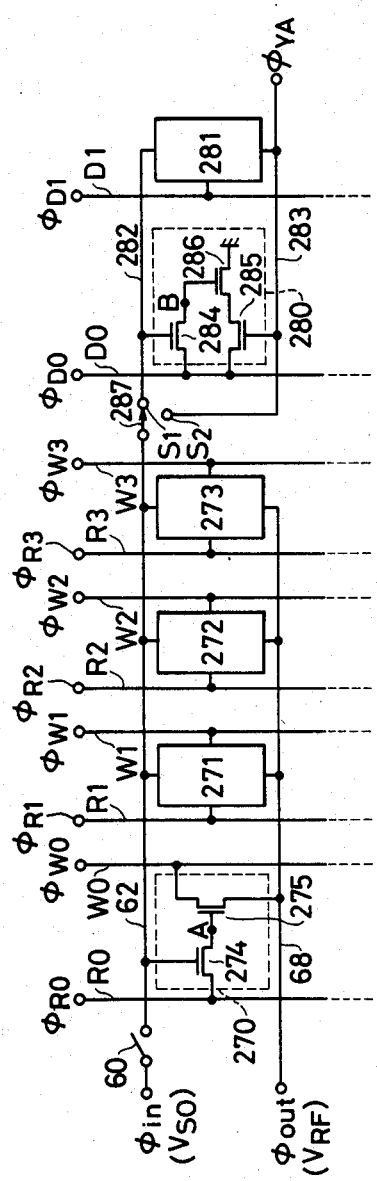
FIG. 27 shows a structure of column register indicating an embodiment of the present invention.

FIG. 27 shows the structure of another embodiment of the column register of the present invention. ($\phi_{R0}$-$\phi_{R3}$, $\phi_{W0}$-$\phi_{W3}$ are arranged reversely to FIG. 4)

In FIG. 27, the second storage cell groups 280, 281 are provided in addition to the first storage cell groups 270-273 arranged previously. The data equivalent to that stored in the first storage cell groups is also stored in such second storage cell groups and the second storage cell groups 280, 281 which assure the high speed data reading are used for reading the data to the external circuits.

The second storage cell groups 280, 281 have the same structure and therefore description about structure of storage cell 281 is omitted here. These storage cell groups are arranged in both upper and lower directions with a plurality of cells. For each cell 280, 281 of the second storage cell groups, the 3-MOS transistor type memory cell, namely, in the case of cell 280, a memory cell using 3-MOS transistors 284, 285, 286, three lines D$_0$, 282, 283 and the earth line is used. In this case, the transistor 284 is used for storing, the transistor 285 is used for reading, the line 282 is used as the write word line, the line 283 is used as the read word line, the line D$_0$ is as the data line and the point B is the storage node.

In general, a number of second storage cells can be determined by log$_2$ n for a number of levels n (n is a positive integer) of the MLS memory. It may be described later, it is of course possible to set a number of second storage cells to a number of levels of MLS memory. From the view point of cost of the circuits to be used, it is obvious a lower number of second storage cells results in a large economical merit.

Figure 28:
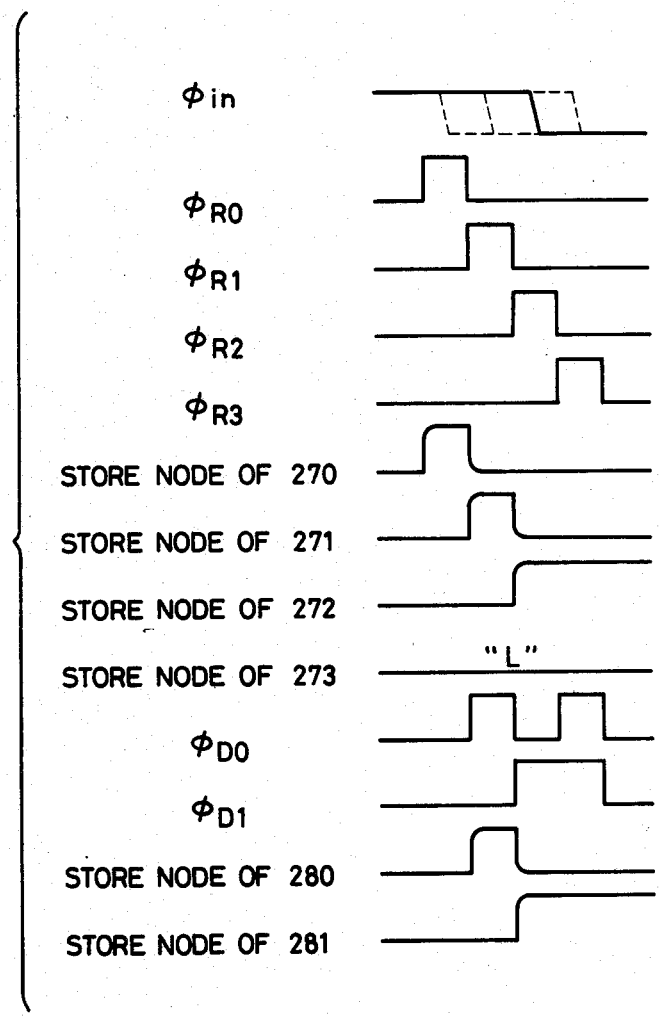
FIG. 28, FIG. 29 and FIG. 30 respectively show operation time charts in FIG. 27.
Figure 29:
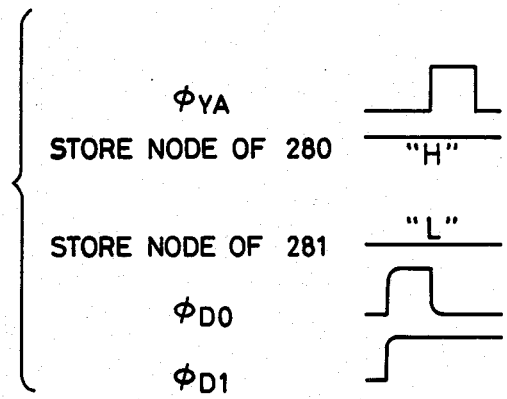
Figure 30:
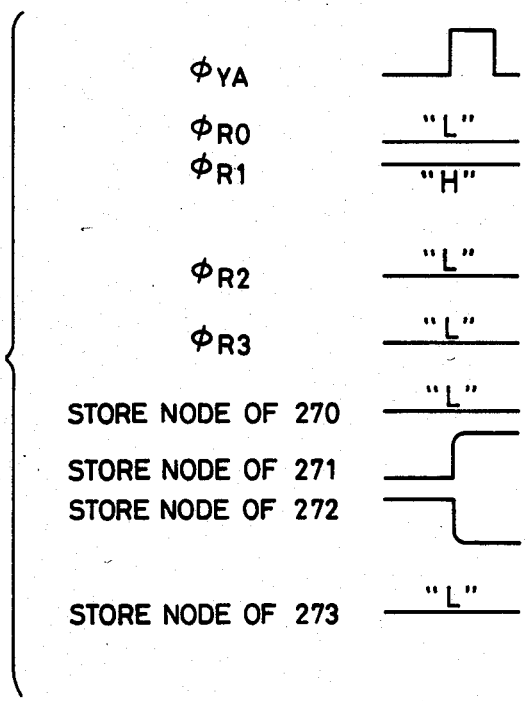

FIG. 28, FIG. 29, FIG. 30 respectively show the writing and reading operation time charts of the column register shown in FIG. 27.

First, explained is the case where the digital data is written corresponding to the timing of the input signal $\phi_{in}$ (V$_{SO}$ of FIG. 4) to change to L level from H level. In this case, the switch 60 of FIG. 27 is turned ON and the switch 287 is connected to the side S$_1$ indicated in the figure. Accordingly, the input signal $\phi_{in}$ is supplied to the first group of storage cells 270 273 and the second group of storage cells 281, 282 from the line 62 to the line 282.

In the case of four levels, the input signal $\phi_{in}$ makes transition to L from H level at the 4 kinds of timings and therefore the digital data corresponding to these timings are written into first and second groups of sotrage cells. Here, explanation of the first group of storage cells is omitted because it is the same as that shown in FIG. 4 and only operations of the second group of storage cells are explained.

The control signal $\phi_{D0}$, $\phi_{D1}$ synchronized with the timing of voltage change of input signal $\phi_{in}$ are respectively supplied to the group of control lines D$_0$, D$_1$ connected to the second group of storage cells. The control signals $\phi_{D0}$, $\phi_{D1}$ change as shown in FIG. 28 in accordance with the 2-bit binary code. Namely, first, both signals are "L", then only $\phi_{D0}$ turns to "H", then only $\phi_{D1}$ turns to "H" and finally both signals are "H". A number of second storage cells can be reduced as small as minimum log$_2$ n by changing the state of such control signals as indicated as ($\phi_{D0}$, $\phi_{D1}$)=("L", "L"), ("H", "L"), ("L", "H"), ("H", "H").

In the example of FIG. 28, when only the control signal $\phi_{D1}$ is "H" level, the input $\phi$in of line 102 turns to "L" from "H". Therefore, the state of control signals $\phi_{D0}$, $\phi_{D1}$ is respectively held in the storage node of storage cells 280, 281. Namely, the storage node of cell 280 is set to "L" level and the storage node of cell 21 is set to "H" level.

Operations of externally reading the data stored in the storage cells of the first column are explained by referring to FIG. 29. At this time, the lines D$_0$, D$_1$ of the second storage cells 280, 281 are precharged to "H" level and thereafter the column select signal $\phi_{YA}$ of the desired column is set to "H". For example, in FIG. 29, since the storage node of storage cells 280, 281 is respectively set to "H" and "L" levels, the signal $\phi_{D0}$ of precharged line D$_0$ is discharged and changes to "L" level from "H" level in the cell 280 because the transistors 285 and 280 turn ON when the storage node B is set to "H" level, but the transistor 286 remains OFF when the storage node B is "L" in the cell 281 and thereby the signal $\phi_{D1}$ of the line D$_1$ being precharged continues to be "H" level.

Operations of externally writing the data to the first storage cell of the first column are explained by referring to FIG. 30. In this case, the switch 60 of FIG. 27 is turned OFF and the switch 287 is set to the side S$_2$ opposing to the position indicated in the figure. Thereby, the column select signal $\phi$YA is supplied to the first group of storage cells 270 273 through the lines 283 and 62. First, the data to be written is set to the control signals $\phi_{R0}$ $\phi_{R3}$. At this time, only one must be "H" level and others must be "L" level. In FIG. 30, only the control signal $\phi_{R1}$ is "H" level. Next, when the column select signal $\phi_{YA}$ of the desired column is set to "H", the preset data is stored to the storage node A of storage cell. In FIG. 30, the storage node of cell 271 is refreshed to "H" from "L", while the storage node of cell 271 to "L" from "H", respectively. At this time, since the column select signal $\phi_{YA}$ is also supplied simultaneously to the second group of storage cells 280, 281, data reading from the second group of storage cell is also carried out in parallel. The read operation is the same as that in FIG. 29.

Operation of controlling output signal $\phi_{out}$ by the data being stored to the first group of storage cells 10-13 is the same as those of FIG. 4 and therefore explanation of it is omitted here.

Figure 31:
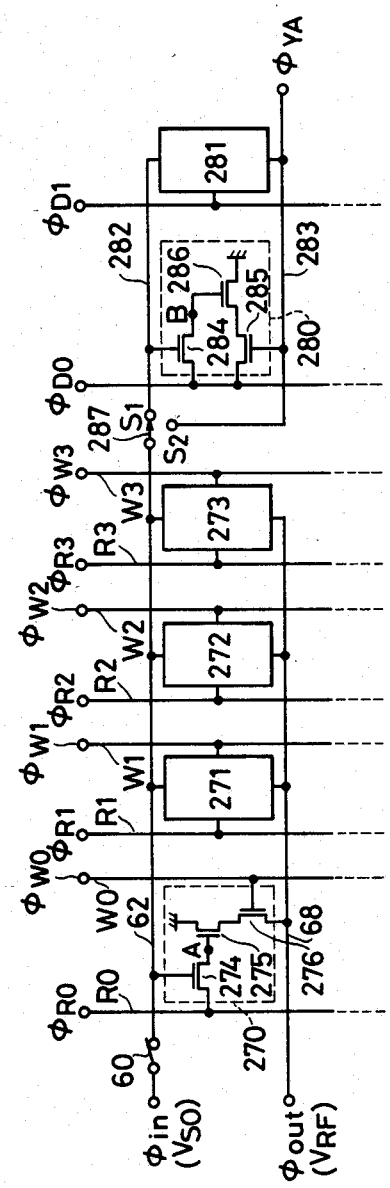
FIG. 31 shows a structure of a column register indicating another embodiment of the present invention.

FIG. 31 shows a constitution of the column register indicating another embodiment of the present invention.

This embodiment is different from that in FIG. 27 in the internal structure of the first group of storage cells 270-273, wherein three MOS transisors are comprised.

Figure 32:
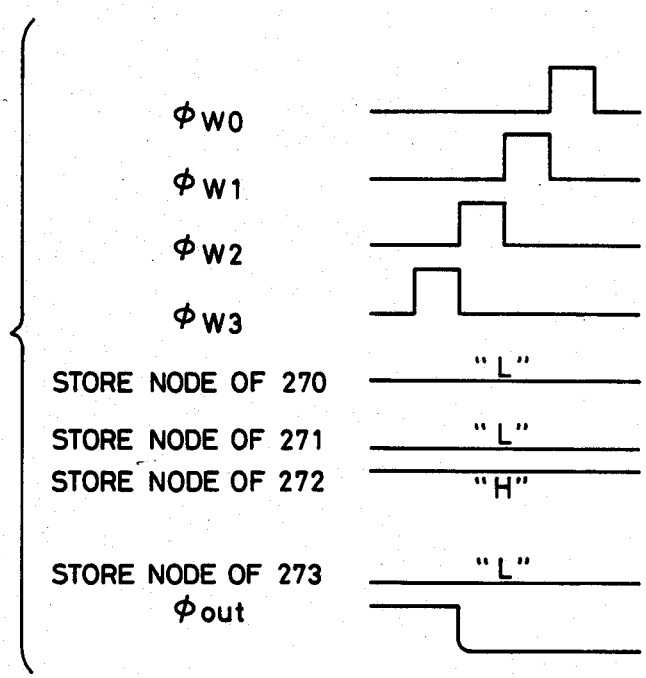
FIG. 32 shows time charts of the circuit shown in FIG. 31.

FIG. 32 shows the operation time chart of the circuit shown in FIG. 31.

Operation of controlling the output signal $\phi_{out}$ by the data being stored in the cells 270-273 is explained below. Other operations are the same as that of FIG. 4.

First, the line 62 connected to the output signal $\phi_{out}$ is precharged to the "H" level. Next, as shown in FIG. 32, the control signals $\phi_{W3}$-$\phi_{W0}$ are sequentially set to the "H" level. The control signals $\phi_{W3}$-$\phi_{W0}$ are supplied to the gate of MOS transistor 276 in the first group of storage cells 270-273 of each column through the control lines $W_0$-$W_3$, making the transistor 276 ON. At this time, when the storage node A is "H" level and the MOS transistor 275 is ON, the precharged line 275 is discharged through the transistors 276 and 275 and thereby this line is set to "L" level. In FIG. 32, since the storage node of storage cell 272 is "H" level, the output signal $\phi_{out}$ becomes "L" level at the timing where the control signal $\phi_{W2}$ becomes "H" level.

In the above embodiment, the same MOS transistor 274 is used in common when the data corresponding to the timing of voltage change of input signal $\phi_{in}$ is written into the first group of storage cells 270 273 and when the data is externally written into the group of storage cells 270 273, but it is of course possible to used different MOS transistors.

Figure 33:
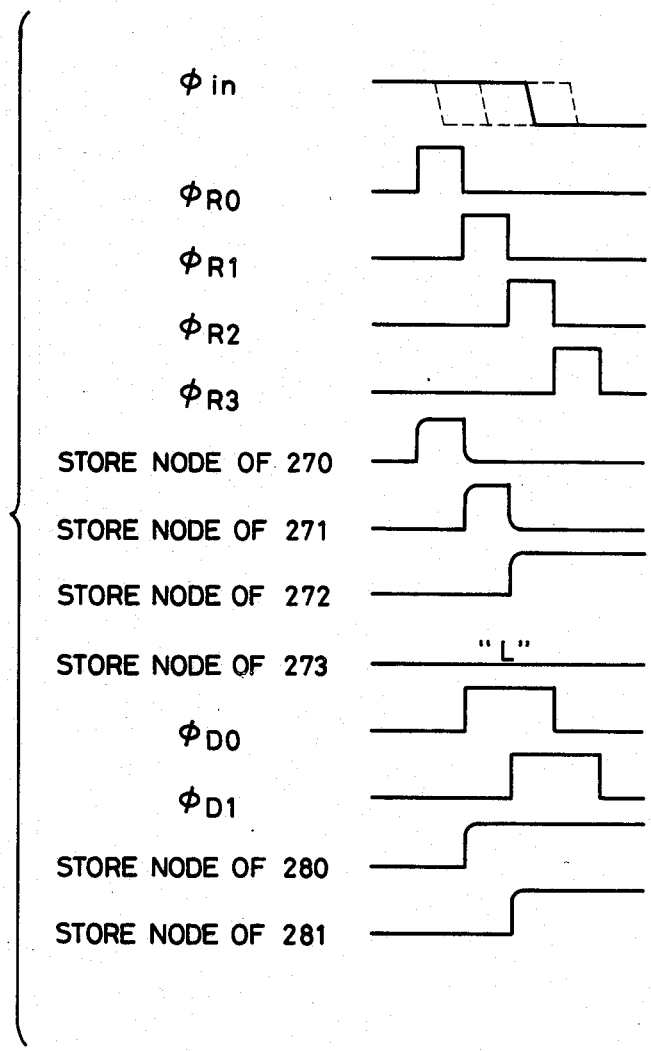
FIG. 33, FIG. 35 and FIG. 36 show operation time charts.

An example where the circuit structure is the same as FIG. 27 but the driving method for writing the data corresponding to the timing of voltage change of input signal $\phi_{in}$ to the second group of storage cells 280, 281 is changed is explained by referring to FIG. 33. The only difference from the driving method of FIG. 28 is the waveforms of control signals $\phi_{D0}$, $\phi_{D1}$. Namely, in FIG. 28, the signals are sequentially changed in accordance with the ordinary binary code, ($\phi_{D0}$, $\phi_{D1}$)=("L", "L"), ("H", "L"), ("L", "H"), ("H", "H"). In FIG. 33, the signals are changed as indicated in accordance with the grey code, ($\phi_{D0}$, $\phi_{D1}$)=("L", "L"), ("H", "L"), ("H", "H"), ("L", "H"). Accordingly, a value stored in the second group of storage cells 280, 281 is different from that of FIG. 27 but it is obvious that four kinds of timings of votlage change of $\phi_{in}$ can be identified by the method explained above. The driving method using the grey code has an advantage that a number of times of rising and falling of the control signals $\phi_{D0}$, $\phi_{D1}$ is lower than that of the driving method shown in FIG. 28. Moreover, the number of storage cells of the second group m is not always required to be equal to $\log_2 n$ and is enough when it is larger than $\log_2 n$ but is smaller than n.

FIG. 15 is the constitution of the column register indicating the other embodiment of the present invention, wherein a number of storage cells of the first group and a number of storage cells of the second group are equal to a number of multiple levels n (n=4). FIG. 16 shows the operation timing chart for writing the data corresponding to the timing of voltage change of input signal $\phi_{in}$ in FIG. 15.

In this embodiment, the control signals $\phi_{D0}$-$\phi_{D3}$ are set sequentially to high level one by one but this method is only an example. Other adequate methods can also be adapted.

Figure 34:
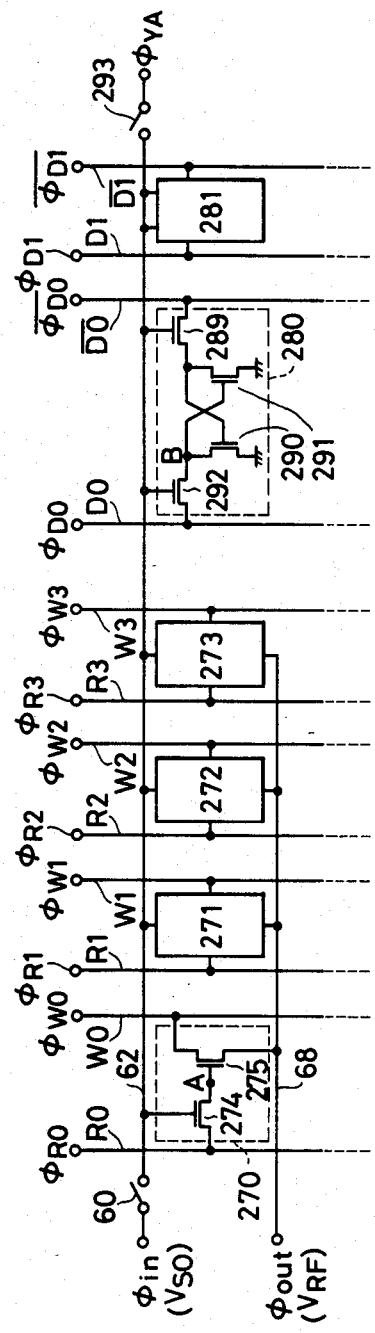
FIG. 34, FIG. 37 respectively show structures of column registers indicating other embodiments of the present invention.

FIG. 34 shows a circuit configuration of the column register of another embodiment of the present invention. FIG. 19 and FIG. 20 show the operation time charts thereof.

Figure 35:
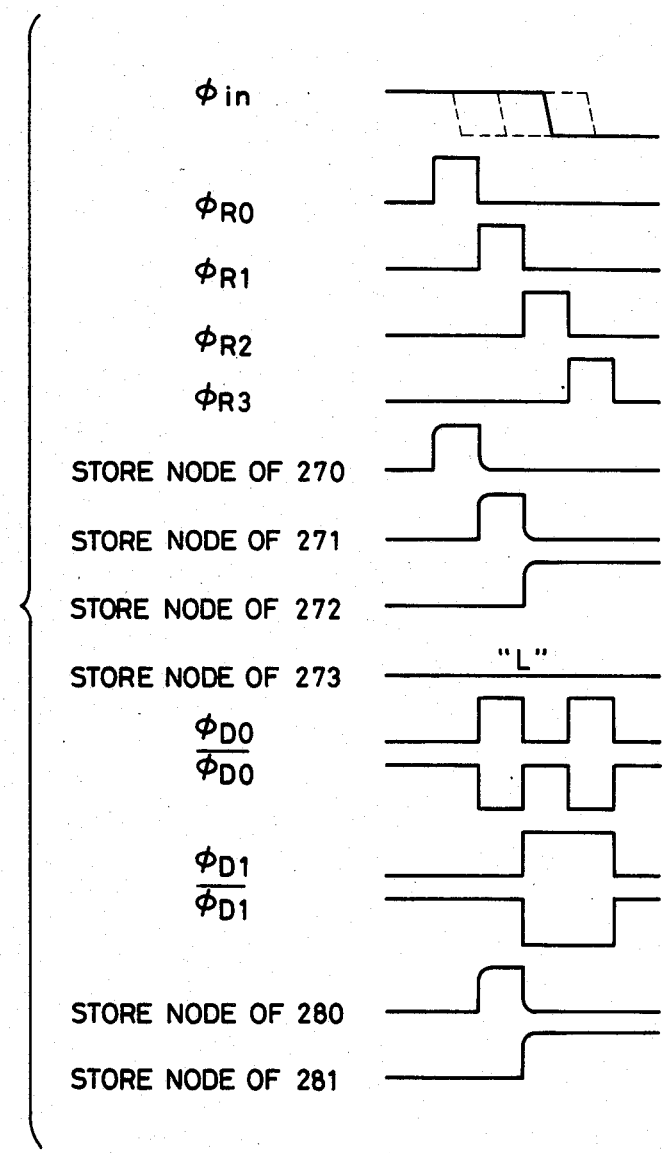
Figure 36:
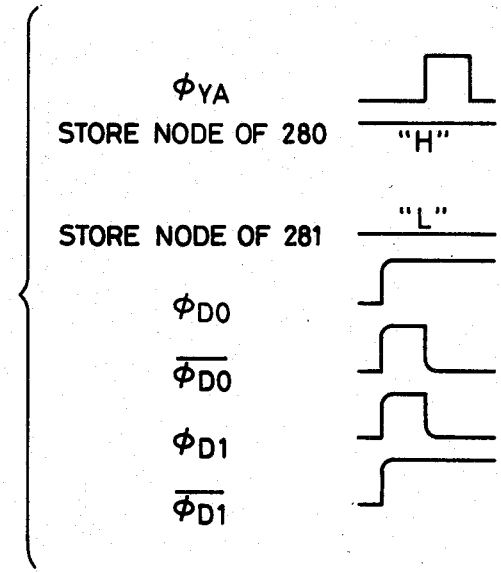

In FIG. 34, the second group of storage cells 280, 281 is composed of 4-MOST type memory cells. The 4-MOST type memory cell is provided with two data lines in order to execute the differential type reading and writing operations. Accordingly, as shown in FIG. 35, the control signals $\phi_{D0}$, $\phi_{D1}$ must be used as the complementary signals of $\phi_{\overline{D0}}$ and $\phi_{\overline{D1}}$ on the occasion of writing the data corresponding to timing of the voltage change of the input signal $\phi_{in}$ into the cells 280 and 281. On the occasion of externally reading the data stored in the cells 280, 281, the signals $\phi_{Di}$, $\phi_{\overline{Di}}$ (i=0,1) are all set to "H" as shown in FIG. 36 and thereafter the column select signal $\phi_{YA}$ is set to "H". Since the write word line and read word line are used in common in the 4-MOST memory cell, the switch 287 in FIG. 27 is unnecessary and the switch 293 is required. The switch 293 is OFF for writing the data corresponding to the timing of voltage change of the input signal $\phi_{in}$ or ON in other cases. This embodiment is superior in the operation speed and noise margin because reading from the second group of storage cells is carried out in the differential mode.

Figure 37:
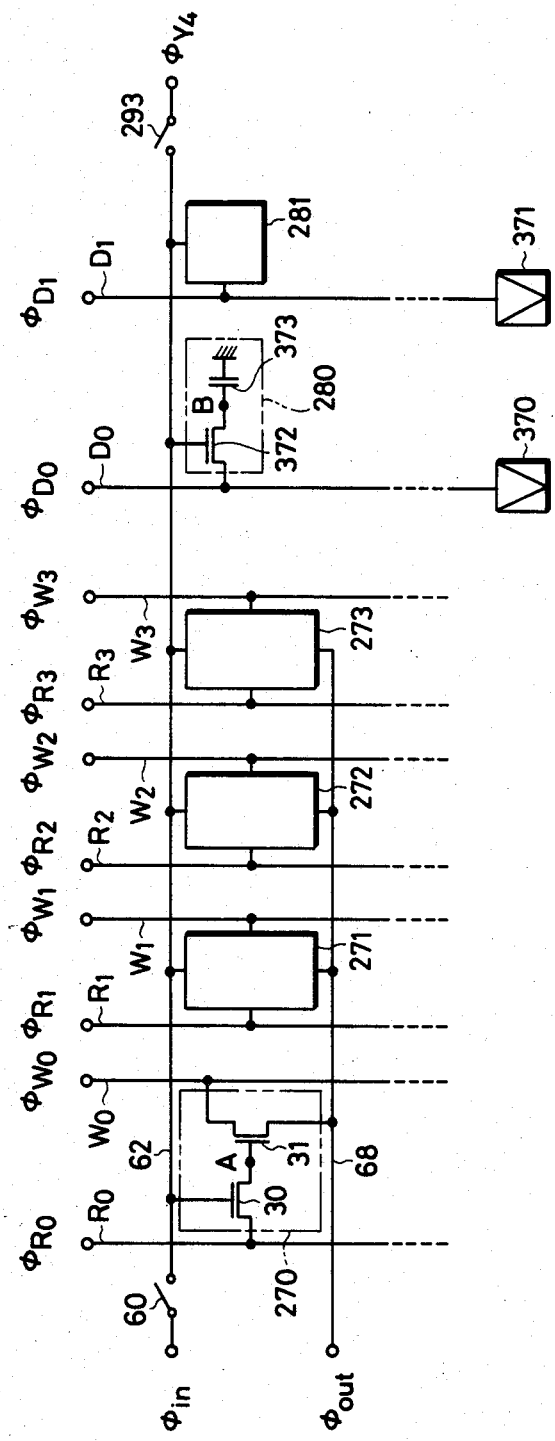

FIG. 37 is a circuit diagram of column register indicating a further embodiment of the present invention. The second group of storage cells 280, 281 is formed by the 1-MOST type memory cell.

This embodiment has an advantage that the second group of storage cell occupies only a small area. However, the 1-MOST type memory cell is not provided with the amplification function in itself and therefore it requires the amplifiers 370 and 371 for amplifying the signal read from the cells 280, 281.

As explained above, the column register of the MLS memory of the present invention is capable of externally reading the data stored in the group of storage cells of the one column and simultaneously writing external data into the group of storage cells of the one column and also storing the multiple level signals in a small number of cells, thus realizing high speed data transfer and parallel writing and reading.

The present invention also provides a fault tolerate circuit which is suited to the memory which serially executes data reading and writing.

Fault toleration can be done as explained below in the memory which serially reads and writes the data. The "location" of a defective memory cell among the regular memory cells, namely in which number the defective memory cell is selected during the serial reading and writing, is previously written into the ROM (Read Only Memory). At the time of data reading (writing), content of data written in the ROM is compared with a number of times of data reading (writing). In case these are matched, the regular memory cell is not selected and the spare memory cell is selected.

Namely, at the timing of selecting the defective data line, such timing is stored in the ROM and the spare memory cell is selected through the switching operation.

Figure 38:
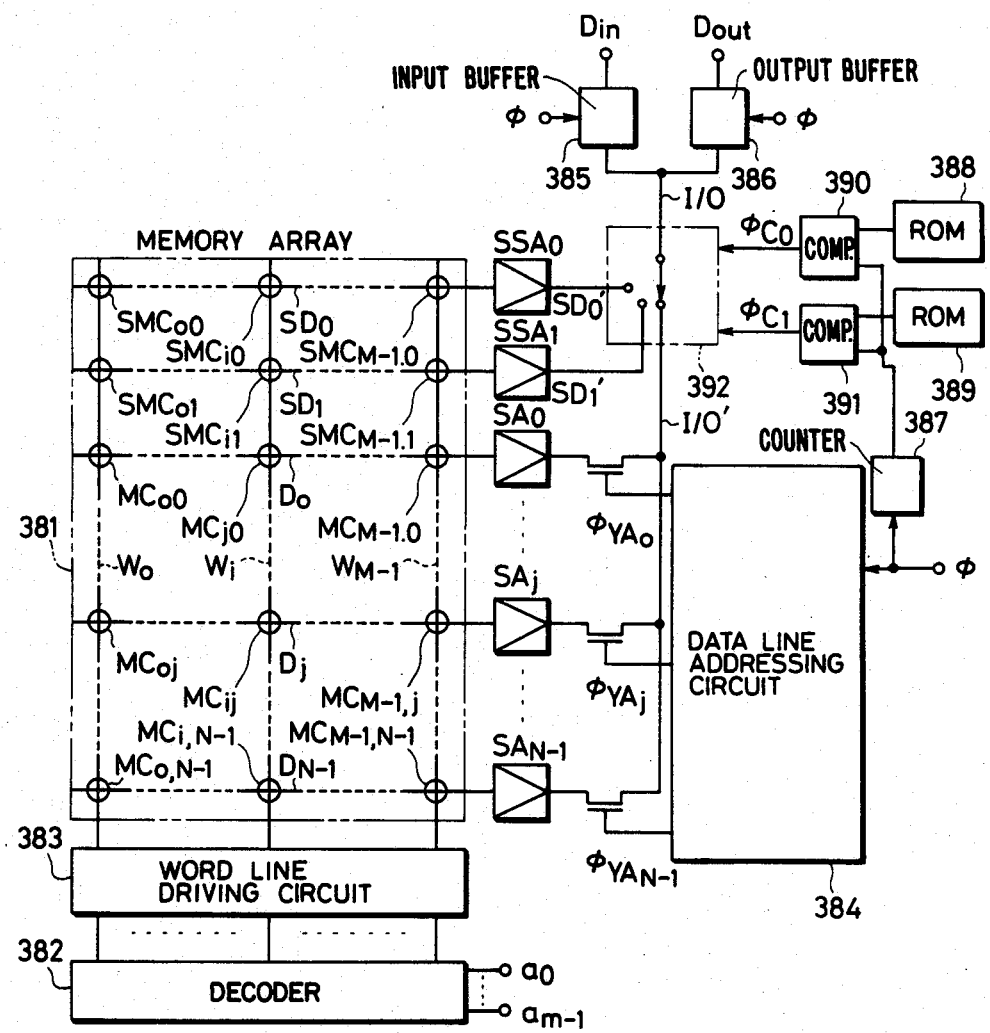
FIG. 38, FIG. 43, FIG. 45 show structures indicating embodiments of semiconductor memories comprising a fault tolerant circuit by the present invention.

FIG. 38 shows an embodiment of the present invention. This memory provides the word lines $W_0$-$W_{N-1}$ as much as $M=2^m$, data lines $D_0$ $D_{N-1}$ as many as $N=2^n$, memory cells $MC_{00}$-$MC_{M-1,N-1}$ as many as MN. Only one word line can be selected arbitrarily by the decoder 382 but the data lines are serially selected in the sequence of $D_0, D_1, \ldots, D_{N-1}$ by a data line select circuit 4 described later. Two spare data lines in total $SD_0, SD_1$ are prepared and are used when any one of the regular data lines $D_0$–$D_{N-1}$ becomes defective. For the separation of the regular dataline and spare data line, a counter 387, ROM's 388 and 389, comparators 390 and 391, and a switching circuit 392 are provided as explained previously. Since two spare data lines are prepared, the ROM and comparator are also provided in two each for the respective spare. This embodiment is explained in detail hereunder.

First, the fault-toleration-free data reading and writing operations are explained. The address signals $a_0$–$a_{m-1}$ are decoded by the decoder 2 and only one word line among the lines $W_0$–$W_{M-1}$ is selected by the word line drive circuit 3. For example, when $W_i$ is selected, data is read on the data lines $D_0$–$D_{N-1}$ from all memory cells $MC_{i0}$–$MC_{iN-1}$ on the $W_i$. This signal is amplified and output by the read lines $AS_0 SA_{N-1}$. As the practical examples of this memory array 381 and read circuits $SA_0$–$SA_{N-1}$, there are the circuits, for example, shown in FIG. 1, FIG. 11 and FIG. 26. The static memory can also use the fault tolerate system described below.

Figure 39:
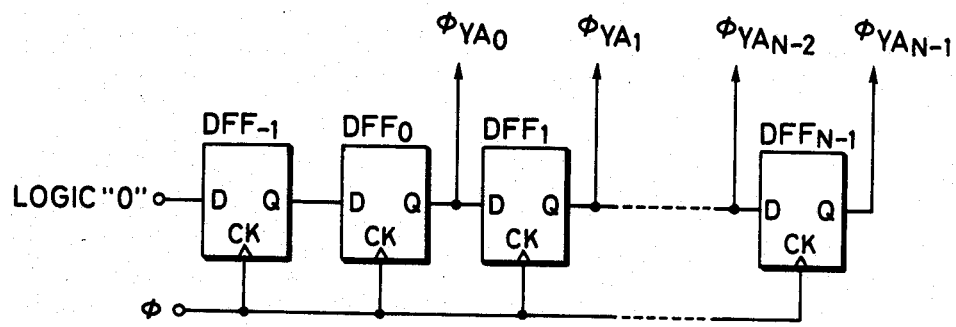
FIG. 39 and FIG. 46 show circuit diagrams of a data line addressing circuit used in said memory.

Then, the data lines $D_0, D_1, \ldots, D_{N-1}$ are selected in this sequence in synchronization with the clock pulse $\phi$. At this time, the data line select circuit 384 must provide one output of logic "1" and logic "0" among the N outputs $\phi_{YA0}$–$\phi YA_{N-1}$. This can be realized, for example, by forming a shift register through connection of $(N+1)$ D flip-flops $DFF_{-1} DFF_{N-1}$ as shown in FIG. 39. Namely, only $DFF_{-1}$ is set to logic "1", other $DFF_0 DFF_{N-1}$ are set to logic "0" and the clock pulse $\phi$ is applied N times. After the pulse $\phi$ is applied $(j+1)$ times, only the $\phi_{YAj}$ becomes logic "1" and the data line $D_j$ is selected.

For each selecton of a single data line, data is output to the external output terminal $D_{out}$ through the output buffer 386 in the case of reading operation. In the case of writing operation, data is extracted from the external input terminal $D_{in}$ through the input buffer 385.

Figure 40:
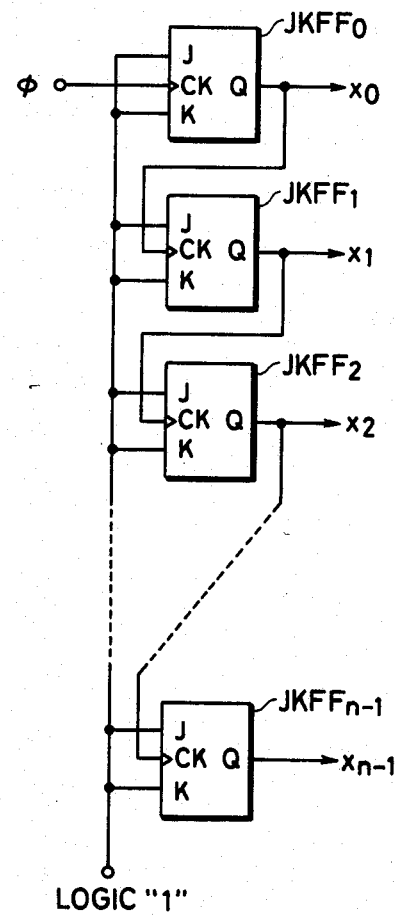
FIG. 40, FIG. 47 show a counter circuit used in said memory.

Next, fault toleration is explained in detail. First, a counter 387 is explained. As a counter 387, those which can count from 0 to $N-1=2^{n-1}$ can be used. For example, an n-bit binary counter utilizing the JK flip-flop (JKFF) as shown in FIG. 40 can be used. For data reading or data writing to/from the memory, the memory is set so that when the outputs $X_0$–$X_{n-1}$ becomes "$-1$" when it is considered as the binary numbers, namely all bits become logic "1" and the pulse $\phi$ which is the same as the signal to be applied to the data line select circuit 384 is applied. When the pulse $\phi$ is applied first, the outputs $X_0$–$X_{n-1}$ are "0", namely all bits becomes logic "0". Thereafter, the bits change to "1", "2", ... for each application of the pulse $\phi$. Accordingly, after the pulse $\phi$ is applied for $(j+1)$ times, an output of counter becomes "j" (as explained above, the data line $D_j$ is selected at this time) and it can be used as the index of indicating the currently selected data line.

Figure 41:
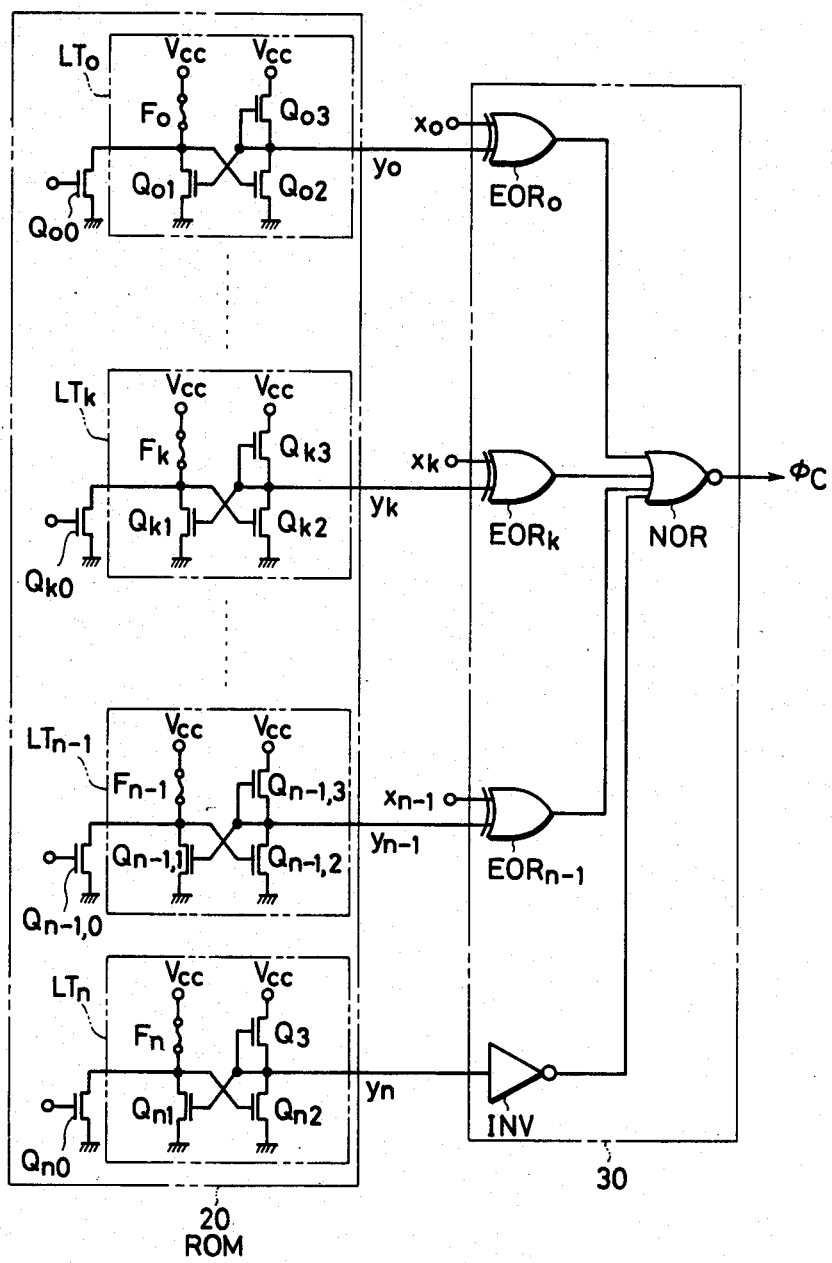
FIG. 41 shows a circuit diagram of a ROM and a comparator used in said memory.

Then, ROM's 388, 389 and comparators 390, 391 are explained. FIG. 41 shows the structure of a pair of a ROM and a comparator. As the ROM, EPROM, $E^2$-PROM or a fuse blown by laser can be used, but the fuses $F_0$–$F_n$ which are blown electrically are used here. The fuse $F_k$ blows by means of a MOS transistor $Q_{k0}$. In order to detect whether the fuse $F_k$ has blown or not, a latch circuit $LT_k$ is formed using two enhancement type MOS transistors $Q_{k1}, Q_{k2}$ and depletion type MOS transistor $Q_{k3}$. An output $y_k$ of the latch circuit $LT_k$ is set to the high level (logic 1) when the fuse $F_k$ has blown or is set to the low level (logic 0) when the fuse $F_k$ is normal.

The outputs $y_0$–$y_{n-1}$ of the latch cricuit are compared with the outputs $X_0$–$X_{n-1}$ of sad counter by the exclusive OR gate ($EOR_k$) and NOR gate (NOR). The comparison output $\phi_c$ becomes logic 1 only when $x_0=y_0, x_1=y_1, \ldots, x_{n-1}=y_{n-1}$. Therefore, when there is defective line in the data lines $D_j$ and it is required to tolerate it, it is enough to determine the fuses to be blown or not (the fuse corresponding to 1 is caused to blow but the fuse corresponding to 0 is not caused to blow) so that "j" indicated by binary notation becomes $y_{n-1}y_{n-2} \ldots y_1y_0$ (namely, $j=y_02^0+y_12^1+ \ldots +y_{n-1}2^{n-1}$). Thereby, when an output of counter becomes "j" (at this time, the data line $D_j$ is selected), an output $\phi_c$ of comparator becomes logic 1.

Here, a number of fuses is set to $(n+1)$ in place of n because one fuse ($F_n$ in FIG. 7) is required for identifying whether fault toleration should be conducted or not. In case fault toleration is not conducted, the fuse $F_n$ is kept normal. Thereby, an output $\phi_c$ is always logic 0. In case fault toleration is conducted, a fuse $F_n$ is blown, and it is determined wither the fuses $F_0$–$F_{n-1}$ should be cut or not in accordance with the location of the data line to be tolerated as explained above.

Figure 42:
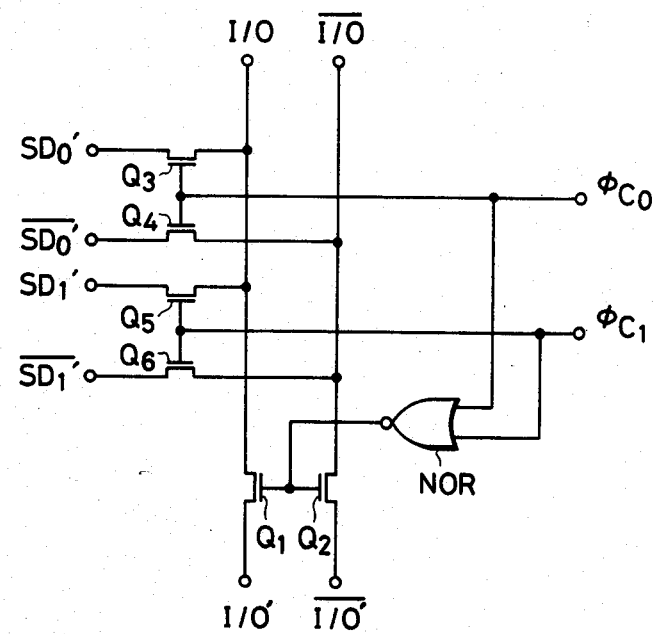
FIG. 42 shows a circuit diagram of a switch circuit used in said memory.

Next, a switching circuit 392 is explained. FIG. 42 shows an example of circuit structure. This circuit switches between the regular data line and spare data line in accordance with the outputs of said comparators $\phi_{c0}, \phi_{c1}$. When the outputs $\phi_{c0}, \phi_{c1}$ are logic 1, the MOS transistors $Q_1, Q_2$ are ON and $Q_3, Q_5$ become OFF. Therefore, data transfer is carried out between the data line selected by the data line select circuit 4 and the input buffer 385 or output buffer 386 through the regular input-output line I/O', I/O'. When, $\phi_{c0}$ is logic 1 and $\phi_{c1}$ is logic 0, the MOS transistors $Q_3, Q_4$ are ON and $Q_1, Q_2, Q_5, Q_6$ are OFF and data transfer is carried out between the lines $SD_0', SD_0'$ or between 385 and 386. At this time, such data transfer is not carried out between the regular input-output lines I/O' and I/O' selected by 384. Namely, the regular data line is replaced by the spare data line $SD_0$. When $\phi_{c1}$ is logic 1 and $\phi_{c0}$ is logic 0, the regular data line is replaced by the spare data line $SD_1$ in the same way.

Since two spare data lines are prepared in this embodiment, fault toleration is possible even when there is a fault in the two regular data line ($D_{j1}$ and $D_{j2}$). Namely, it is enough that "$j_1$" is written in the ROM 388 and "$j_2$" to the ROM 389. Thereby, it is obvious from above description that the regular data lines $D_{j1}, D_{j2}$ are respectively replaced by the spare data lines $SD_0, SD_1$.

In this embodment, fault toleration is not carried out for the word lines. However, one word line can be seleted arbitrarily by the decoder 2 and therefore fault toleration of word lines can also be done in the same way as the existing method.

Figure 43:
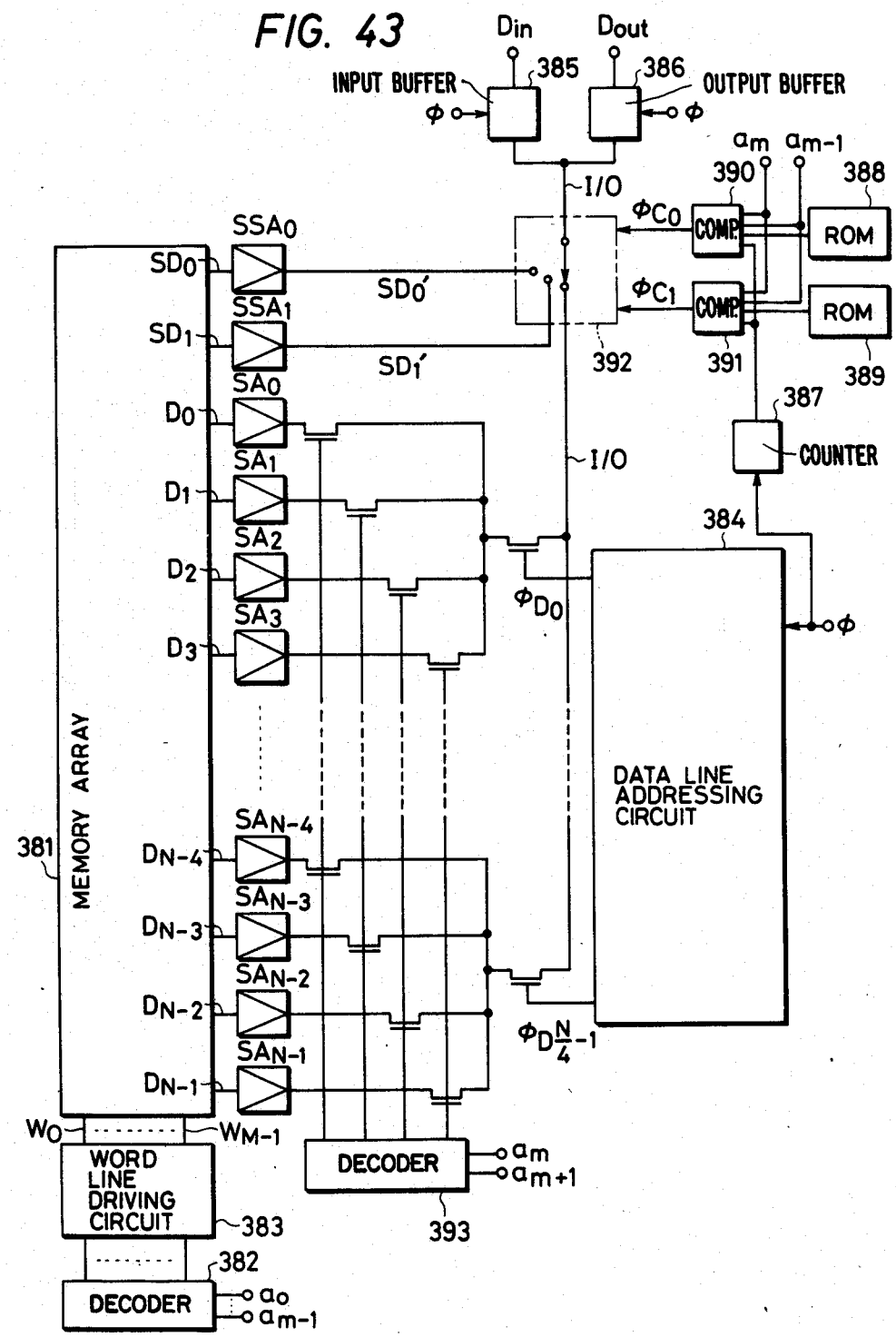

In above embodiment, data reading or writing is executed sequentially for all memory cells on a single word line but is can also be done for only a part of a memory cell on the word line. FIG. 43 shows this example where the reading or writing is carried out to N/4 memory cells among N memory cells on the single word line is the embodiment of FIG. 38. This embodiment is described in detail below.

The memory array 381, decoder 382, word line drive circuit 383 and read circuits $SSA_0, SSA_1, SA_0$–$SA_{N-1}$ are provided as in the case of embodiment of FIG. 38.

The data line select circuit 384 sequentially selects data lines in synchronization with the clock pulse $\phi$ as in the case of FIG. 38, but in this embodiment, only one data line group is selected from N/4 data line groups (each consisting of four data lines). Selection of a single data line is carried out using the signal obtained by decoding the address signals $a_m$, $a_{m+1}$ with the decoder 393. When $a_m = a_{m+1} = 0$, the data line $D_{4l}$ (l is an integer) is selected. When $a_m = 1$ and $a_{m+1} = 0$, the data line $D_{4+1}$ is selected. When $a_m = 0$ and $a_{m+1} = 1$, the data line $D_{4+2}$ is selected. When $a_m = a_{m+1} = 1$, the data line $D_{4+3}$ is selected. Therefore, in case data reading or writing is conducted in serial, the N/4 data lines are selected for every four lines. For example, when $a_m = a_{m+1} = 0$, $D_0, D_4, D_8, \ldots, D_{N-4}$ are selected sequentially.

The fault tolerate circuit of the present embodiment is now explained. First, since the counter 387 is capable of counting from 0 to $N/4 - 1 = 2^{n-2} - 1$, the $(n-2)$-bit binary counter is used. The outputs $X_2$-$X_{n-1}$ of counter can be used as the index which indicates which data line group is now selected as in the case of FIG. 38. ROM's 388 and 389 are the same as those shown in FIG. 41. For the fault toleration, it is determined how each fuse should be blown so that the outputs $y_2 y_{n-1}$ among the outputs $y_0$-$y_{n-1}$ of ROM indicate the location of data line group including the data line to be fault-tolerated and $y_0$, $y_1$ indicate the location of such data lines in the data line group (namely, the line is selected in which combination of $a_m$ and $a_{m+1}$).

Figure 44:
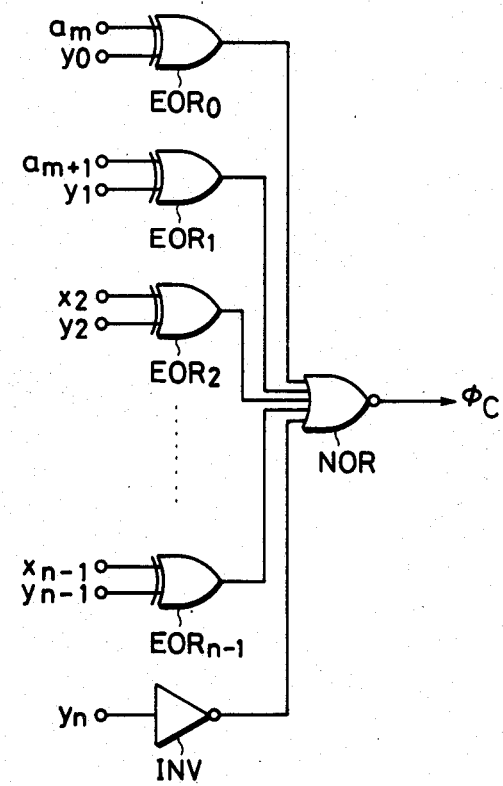
FIG. 44 shows a circuit diagram of a comparator used in said memory.

Next, the comparators 390 and 391 are explained. FIG. 44 shows the structure of comparator. The circuit structure itself is the same as that shown in FIG. 41 but there is such a difference that the address signals $a_m$, $a_{m+1}$ are input in addition to the outputs $x_2$-$x_{n-1}$ of the counter. The output $\phi_c$ of comparator becomes logic 1 only when $a_m = y_0$, $a_{m+1} = y_1$, $x_2 = y_2, \ldots, x_{n-1} = y_{n-1}$, namely when the data line group including the data line to be fault-tolerated is selected ($x_2 = y_2, \ldots, x_{n-1} = y_{n-1}$) and the address signals $a_m$, $a_{m+1}$ matches with the location ($x_0$, $x_1$) in the data line group of such data line.

The switching circuit 392 is the same as that shown in FIG. 42 and therefor explanation thereof is omitted here.

Figure 45:
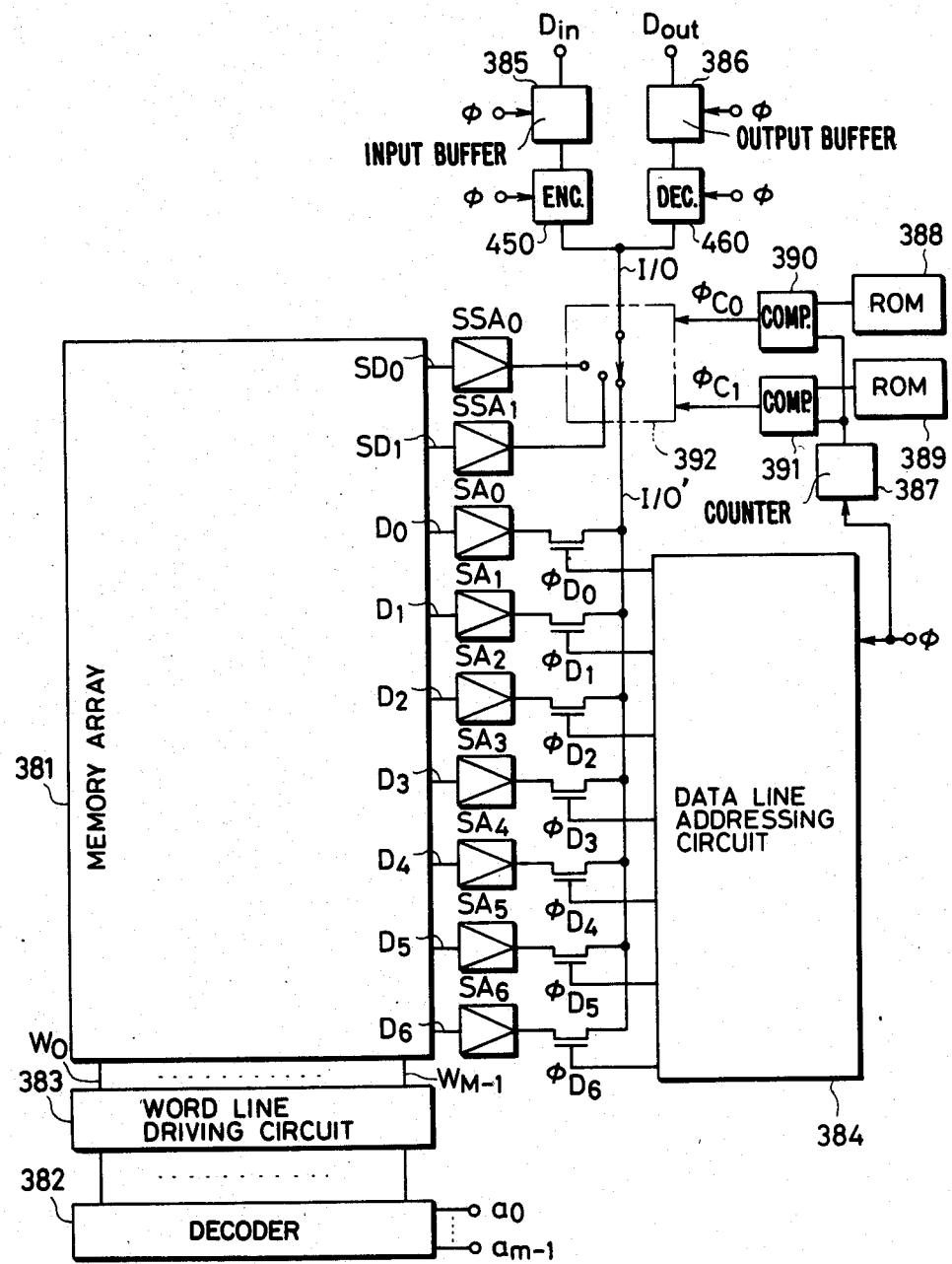

FIG. 45 shows another embodiment of the present invention. This embodiment is characterized by providing redundant bits by the error correcting code (hereinafter referred to as ECC). For simplification, the ECC uses 4 information bits, 3 check bits and cyclic Hamming code and other codes can of course be used for the present invention. Of 7 data lines, $D_0$-$D_3$ are used for the information storing and $D_4$-$D_6$, for storing redundant bits of ECC. The redundant bits for ECC are added in the encoding circuit 450 and error correction is carried out in the decoding circuit. This embodiment is explained in detail.

Figure 46:
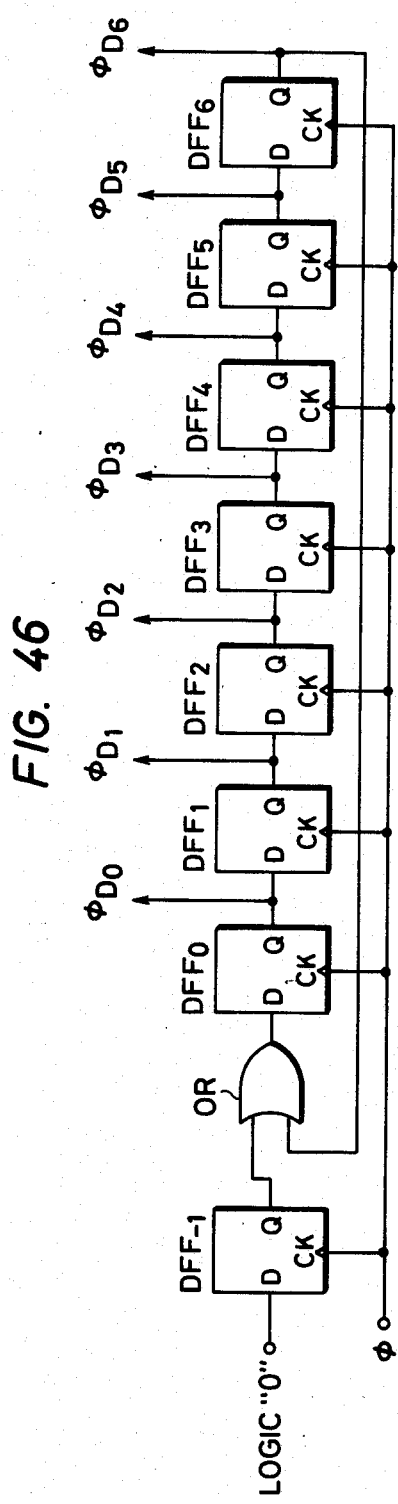

The memory array 381, decoder 382, word line drive circuit 383 and sense amplifiers $SSA_0$, $SSA_1$, $SA_0$--$SA_{N-1}$ are provided as in the case of embodiment shown in FIG. 38. The data line select circuit 384 must be capable of selecting not only the data line for storing information but also the data line for storing redundant bit of ECC. Moreover, as described later, in the case of data reading operation, the data line must be selected twice in each operation in the sequence of $D_1, \ldots, D_6$, $D_0, D_1, \ldots, D_6$. FIG. 46 shows an example of a circuit which satisfies such requirement.

The encoding circuit 450 is explained hereunder. This circuit executes encoding serially in synchronization with the clock pulse $\phi$ using the nature of cyclic code. When the clock pulse $\phi$ is first applied four times, the data entering from external input terminal $D_{in}$ through the input buffer 385 is directly issued to the input-output line I/O (at this time, redundant bit is also generated simultaneously). When the clock pulse $\phi$ is applied three times in succession (in this case, data is not input from $D_{in}$), the generated redundant bits are sequentially issued to the I/O. Since the data line select circuit 4 selects the data lines in the sequence of $D_0, D_1, \ldots, D_6$, the information bits (data entering from $D_{in}$) are written into the memory cells on the data line $D_0$-$D_3$, while the redundant bits to the memory cells are written on the data lines $D_4$-$D_6$.

The decoding circuit 460 is described. This circuit executes the decoding serially in synchronization with the clock pulse $\phi$, using the nature of cyclic code. When the clock pulse $\phi$ is first applied seven times, the data lines are selected in the sequence of $D_0, D_1, \ldots, D_6$ by the data line select circuit 388 and the data read from each memory cell is sequentially applied to the decoding circuit through the input-output line I/O. At this time, 460 executes the calculation of syndrome. Next, when the clock pulse $\phi$ is applied seven times, the error corrected data are sequentially issued to the input-output line I/O. At this time, the data lines $D_0, D_1, \ldots, D_6$ are selected again in this sequence by the data line select circuit 384 and therefore the corrected data is sequentially written into the original memory cell. The first four bits (information bits) among the corrected data are sequentially issued to the external output terminal $D_{out}$ through the output buffer.

Figure 47:
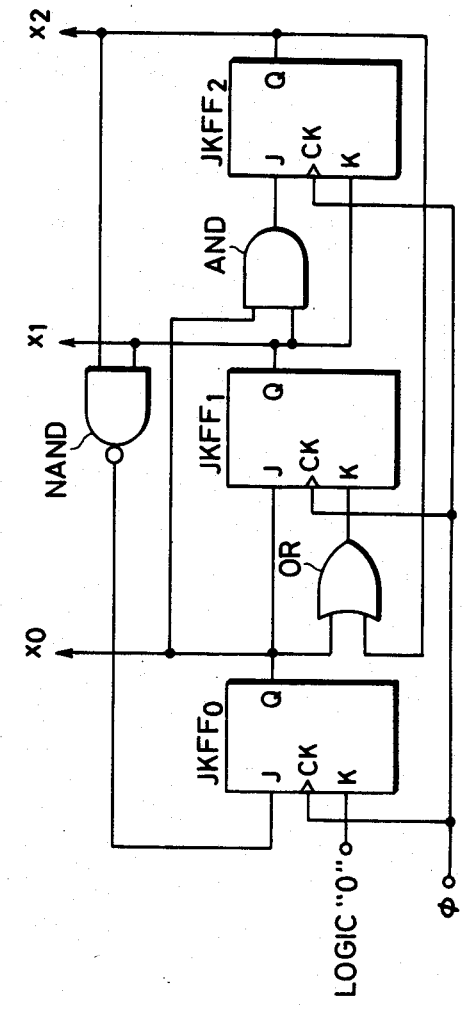

Here, the fault-tolerate circuit of this embodiment is explained. First, the counter 387 is described below. As is described above, in the case of data reading operation, the data lines are selected in the sequence of $D_0, D_1, \ldots, D_6$, and thereby output of counter 387 must be changed in the sequence of "0", "1", ..., "6", "0", "1", ..., "6". This can be realized by employing a septenary counter using a JK flip-flop shown in FIG. 47. The ROM's 388 and 389, comparators 390, 391 and switching circuit 392 are the same as those shown in FIG. 42. However, since a total of seven data lines are prepared including the redundant data lines for ECC, the ROM requires 4 bits (one bit of them is used for identifying whether fault toleration must be conducted or not) and the exclusive OR gate of comparator requires three bits.

As described above, the present invention can include the fault toleration for the memory which serially carries out data reading and writing and thereby a chip containing a small number of defects can be converted to a good chip, thus improving the yield.

What is claimed is:

1. A semiconductor memory having multiple level storage structure at least comprising a memory array including a plurality of memory cells respectively having at least one storage capacitor, an address selecting means which designates location of each memory cell, data lines which transfer data through connections to said memory cells and data writing and reading means being connected to said data lines, said memory further comprising a means for sequentially applying, on time series basis, different voltages of at least three levels or more to said memory cells, at least a data judging means, a first transfer gate provided between said judging means and data lines and a bias charge supplying means provided between said first transfer gate and the judging means, as said data reading means, and a column register providing at least two or more storage cells which temporarily store said judged data.

2. A semiconductor memory having multiple level storage structure according to claim 1, wherein the bias charge supplying means comprises a precharge gate which is connected to the capacitor and the node between said capacitor and data judging means and a means which gives a pulse for supplying charges under the capacitor temporarily to the data lines and thereafter returns such charges.

3. A semiconductor memory having multiple level storage structure according to claim 2 wherein a second transfer gate is provided between the capacitor and data judging means which form the bias charge supplying means.

4. A semiconductor memory having multiple level storage structure according to claim 2 wherein a capacitor which forms the bias charge supplying means is formed by a depletion type MISFET.

5. A semiconductor memory having multiple level storage structure according to claim 2 wherein a capacitor which forms the bias charge supplying means is composed of an electrode formed on an insulating film and a high concentration semiconductor region formed under said insulating film.

6. A semiconductor memory having multiple level storage structure according to claim 2 wherein a capacitor which forms the bias charge supplying means is composed of an electrode, an insulating film and a semiconductor formed by the same process required for configuring the memory cells.

7. A semiconductor memory having multiple level strorage structure according to claim 1 wherein the memory cell array is located on the intersecting points of row address lines (word lines) and the data lines crossing thereto, the memory cells are composed of storage capacitors and the word gates which connect between the storage capacitors and data lines and are controlled by the voltage applied to the word lines, and a means for sequentially applying the time series voltages of at least three levels or more to the word gates is also provided.

8. A semiconductor memory having multiple level storage structure according to claim 1 wherein a column register is provided for each judging means, said column registers are started in such a timing that the charges which become data source discharge to the data lines by the time series voltages of three levels or more to be applied to the memory cells, and a means for temporarily storing the digital binary data generated in synchronization with said time series voltages or its decoded data to said column registers is also provided.

9. A semiconductor memory having multiple level storage structure according to claim 1 wherein, provided as the data writing means is a means which at least provides reset gates and writing gates connected to the data lines, extracts charge carrier by starting the writing gate in such a timing corresponding to the write data being synchronized with the time series voltages of three levels or more to be applied to the memory cells after the memory cells are filled with charge carriers by the reset gates, and writes multiple level data by retaining the charges which carry data of three levels or more corresponding to the time series voltages within the memory cells.

10. A semiconductor memory having multiple level storage structure according to claim 9 wherein a means which gives a timing pulse to the writing gate by referring to the data stored in the column register by the reading operation prior to the writing operation is provided as the refresh means.

11. A semiconductor memory having multiple level storage structure according to claim 1 wherein a reference cell (dummay cell) which reads charges of about $\frac{1}{2}$ of signal charges per level in the memory cell and supplies it for each judgment is provided and a means which compares said signal charges with charges sent from dummy cells for judgment is provided as the data judging means.

12. A semiconductor memory having multiple level storage structure according to claim 11, comprising a row address select means where the data lines for reading signal charges sent from the memory cells and the data lines for reading reference charges sent from the dummy cell are provided in parallel, the memory cells and dummy cells are disposed so that when the one transmits signal charges, the other respectively transmits the reference charges, and selection of memory cells and dummy cells is also carried out corresponding thereto.

13. A semiconductor memory having multiple level storage structure according to claim 11 further comprising, as the data judging means, a flip-flop type judging means where two equivalent input terminals are provided so that the signal charges sent from the memory cells and reference charges sent from the dummy cells are input thereto respectively, the drains of at least a pair of MISFET's are respectively connected to said input terminals, and said input terminals are also connected to the gates in the opposite sides.

14. A semiconductor memory having multiple level storage structure according to claim 11 further comprising, as a data judging means, the seven pairs of MISFET's where two equivalent input terminals to which the signal charges sent from the memory cells and the reference charges sent from the dummy cells are applied are provided, these are respectively connected to the input gates and the sources are connected in common, a current supplying means connected to said common source, a pair of loads respectively connected to the drains of MISFET's and a switch gate which short-circuits the input gates and drain terminals of said MISFET's.

15. A semiconductor memory having multiple level storage structure according to claim 1 further comprising, as the data judging means, an amplifier having a MISFET for amplification where the input terminal to which the signal charges sent from the memory cells are input is connected to the gate while the drain is connected to the output terminal respectively and when said gate and drain are short-circuited the operating point is set to the sub-threshold region, a first switch means which connects the gate or drain of said MISFET to the power supply, a second switch means which short-circuits or opens the gate and drain of said MISFET and a third switch means which controls a current flowing into said MISFET.

16. A semiconductor memory having multiple level storage structure according to claim 1 further comprising a circuit for decoding the input digital binary data into multiple level data and a means which sequentially extracts said decoded multiple level data and sends it to the writing means in synchronization with the time series voltages of three levels or more to be applied to the memory cells during the writing operation.

17. A semiconductor memory having multiple level storage structure according to claim 1 wherein a column register is composed of storage cells storing only the binary data, at least $N-1$ or more storage cells are provided for each judging means when a number of multiple levels is N, a means for directly storing the multiple level data sent from memory cells of array is provided, and comprising an encoder having a second column register which sequentially sends such multiple level data and stores it, a means for simultaneously sending the data of a second column register to the encoding circuit and an encoding circuit which converts the multiple level data into the binary data.

18. A semiconductor memory having multiple level storage structure according to claim 1 further comprising a triggering pulse generator of variable frequencies having pseudo memory cells comprised of an electrode, an insulating film and a semiconductor formed by the same process as that required for configuring a capacitor for forming memory cells and a means which senses the discharge period of said pseudo memory cells and controls the oscillation frequency.

19. A semiconductor memory having multiple level storage structure according to claim 1 wherein the memory cell array is located at the intersecting points of the first row address lines, the second row address lines (plate lines) which are paired to said first row address lines (word lines) and provided in parallel thereto and the data lines crossing these lines, the memory cells are formed by the storage capacitors and the word gates provided between said storage capacitors and data lines, the gate electrode of a word gate is connected to the word lines and an electrode of the storage capacitor is connected to the plate lines, a means for sequentially applying the time series voltages of at least three levels or more to the plate line of selected row address and a means which makes conductive, with the voltage applied to said plate lines, the word gate of a row address selected by a voltage which is lower when electrons are signal charges or higher when holes are than the voltage to be applied to the storage capacitors are provided, at least the reset gate and write gate where the one terminal is respectively connected to the data lines are provided as the writing means, another terminal of the reset gate is connected, when the word gate is conductive, to a means which gives a voltage lower or higher than the channel voltage under the gate when electrons are signal charges or holes are, and the other terminal of a writing gate is connected, when the word gate is conductive, to a voltage which is higher or lower than the channel voltage under the gate when the electron is signal charges or hole are.

20. A semiconductor memory having multiple level storage structure according to claim 1 wherein said column register which writes digital data corresponding to the timing of voltage change of input signal into the first group of storage cells and reads the data being stored in said first group of storage cells as the write signal to said semiconductor memory having multiple level storage structure, hence disposing a plurality of columns of a ssecond group of storage cells incorporated to said first group of storage cells and comprising a first means for writing the digital data corresponding to the timing of voltage change of said input signal to said second group of storage cells, a second means which reads data in parallel from the second group of storage cells of the selected columns and a third means which writes data in parallel to said first group of storage cells on the selected columns.

21. A semiconductor memory having multiple level storage structure according to claim 1 wherein said second group of storage cells has the cells as many as the minimum integer m of $\log_2 n$ or more when a number of levels of said semiconductor memory having multiple level of storage structure is n.

22. A semiconductor memory having multiple level storage structure according to claim 2 wherein said first means supplies the m-bit code corresponding to the timing of voltage change of input signal to the writing control line group connected to the second group of storage cells and also writes thereto the digital data corresponding to the timing of voltage change of an input signal.

23. A semiconductor memory having multiple level storage structure according to claim 20 wherein said second means controls a voltage of a reading control line group connected to said second group of storage cells with the data stored in said second group of storage cells of selected columns.

24. A semiconductor memory having multiple level storage structure according to claim 3 or 4 wherein the writing control line group and reading control line group are used in common for said first and second means.

25. A semiconductor memory having multiple level storage structure according to claim 1 wherein said third means supplies the data to be written from the writing control line group connected to said first group of storage cells of each column.

26. A semiconductor memory having multiple level storage structure according to claim 1 wherein said second means and third means execute simultaneously the reading of data stored to said second group of storage cells and the writing of data to said first group of storage cells.

27. A semiconductor memory having multiple level storage structure according to claim 1 comprising, for fault toleration, a counter which executes counting in synchronization with the clock pulse, a ROM for storing location of defective memory cells or memory cell group, a comparator which compares an output of said counter and content of said ROM and a switching circuit which switches the regular memory cell or memory cell group or spare memory cell or memory cell group in accordance with an output of said comparator.

28. A semiconductor memory having multiple level storage structure according to claim 27 wherein said memory array is formed by providing memory cells at the intersecting points of a plurality of word lines and a plurality of data lines and comprises a means for serially reading or writing data of a part or all of the memory cells on the selected word lines in synchronization with the clock pulse, said ROM is used for storing location of data lines including defective memory cells or memory cell group, and said switching circuit is used for switching the regular data lines and spare data lines.

* * * * *